US009433293B2

(12) United States Patent
Gross et al.

(10) Patent No.: US 9,433,293 B2
(45) Date of Patent: Sep. 6, 2016

(54) ARTICULATING MOUNT FOR FLAT PANEL DISPLAY

(71) Applicant: MILESTONE AV TECHNOLOGIES LLC, Eden Prairie, MN (US)

(72) Inventors: Curtis Gross, Blaine, MN (US); Scott Russell, Woodbury, MN (US); Jay Dittmer, Prior Lake, MN (US); Nick Stanek, Roseville, MN (US)

(73) Assignee: Milestone AV Technologies LLC, Eden Prairie, MN (US)

( * ) Notice: Subject to any disclaimer, the term of this patent is extended or adjusted under 35 U.S.C. 154(b) by 0 days.

(21) Appl. No.: 14/433,569

(22) PCT Filed: Mar. 15, 2013

(86) PCT No.: PCT/US2013/032576
§ 371 (c)(1),
(2) Date: Apr. 3, 2015

(87) PCT Pub. No.: WO2014/055128
PCT Pub. Date: Apr. 10, 2014

(65) Prior Publication Data
US 2015/0250315 A1 Sep. 10, 2015

Related U.S. Application Data

(60) Provisional application No. 61/709,916, filed on Oct. 4, 2012.

(51) Int. Cl.
*G06F 1/16* (2006.01)
*A47B 97/00* (2006.01)
(Continued)

(52) U.S. Cl.
CPC ............ *A47B 97/001* (2013.01); *F16M 11/041* (2013.01); *F16M 11/10* (2013.01);
(Continued)

(58) Field of Classification Search
CPC .......... A47B 97/001; A47B 2097/003; F16M 11/041; F16M 11/10; F16M 11/2014; F16M 11/2092; F16M 13/02; F16M 13/022; H05K 5/0017; H05K 5/0204; H05K 5/0226; H05K 5/0247
USPC ............. 361/679.01–679.45, 679.55–679.59; 248/917–924
See application file for complete search history.

(56) References Cited

U.S. PATENT DOCUMENTS 7,487,943 B1 2/2009 Gillesple
RE43,696 E * 10/2012 Graham ................ F16M 13/02
248/298.1

(Continued)

FOREIGN PATENT DOCUMENTS

WO WO 2011085085 A2 * 7/2011 ............. F16M 11/10
WO WO 2012/006016 A2 1/2012

OTHER PUBLICATIONS

PCT Notification Concerning Transmittal of International Preliminary Report on Patentability, International Preliminary Report on Patentability, and Written Opinion of the International Searching Authority for PCT/US2013/032576, mailed Apr. 16, 2015, 8 pgs.

(Continued)

*Primary Examiner* — Nidhi Thaker
(74) *Attorney, Agent, or Firm* — Patterson Thuente Pedersen, P.A.

(57) ABSTRACT

A mounting system for an electronic display including a wall interface, a display interface, and an arm assembly operably coupling the wall interface to the display interface. The display interface includes a pair of spaced-apart vertical mounting assemblies operably coupled by a pair of spaced-apart horizontal assemblies, the vertical mounting assemblies being shiftable relative to each other with the horizontal assemblies.

18 Claims, 25 Drawing Sheets

(51) Int. Cl.
*F16M 11/10* (2006.01)
*F16M 11/04* (2006.01)
*F16M 11/20* (2006.01)
*F16M 13/02* (2006.01)
*H05K 5/00* (2006.01)
*H05K 5/02* (2006.01)

(52) U.S. Cl.
CPC ...... *F16M11/2014* (2013.01); *F16M 11/2092* (2013.01); *F16M 13/02* (2013.01); *F16M 13/022* (2013.01); *H05K 5/0017* (2013.01); *H05K 5/0204* (2013.01); *H05K 5/0226* (2013.01); *H05K 5/0247* (2013.01); *A47B 2097/003* (2013.01); *F16M 2200/061* (2013.01)

(56) References Cited

U.S. PATENT DOCUMENTS

| | | | | |
|---|---|---|---|---|
| 8,891,249 B2 * | 11/2014 | Stanek | ............ | F16M 11/10 248/276.1 |
| 9,109,742 B2 * | 8/2015 | Smith | ............ | F16M 11/10 |
| 2007/0007413 A1 * | 1/2007 | Jung | ............ | F16M 11/10 248/284.1 |
| 2008/0237424 A1 | 10/2008 | Clary | | |
| 2009/0020673 A1 | 1/2009 | Dittmer | | |
| 2010/0208418 A1 | 8/2010 | Russell | | |
| 2010/0309615 A1 * | 12/2010 | Grey | ............ | F16M 11/10 361/679.01 |
| 2012/0032038 A1 * | 2/2012 | Ye | ............ | F16M 11/08 248/122.1 |
| 2012/0032062 A1 * | 2/2012 | Newville | ............ | F16M 11/08 248/575 |
| 2012/0320506 A1 * | 12/2012 | Bentz | ............ | G06F 1/1632 361/679.01 |

OTHER PUBLICATIONS

International Search Report for International Application No. PCT/US2013/032576, mailed Jul. 22, 2013, 2 pages.

* cited by examiner

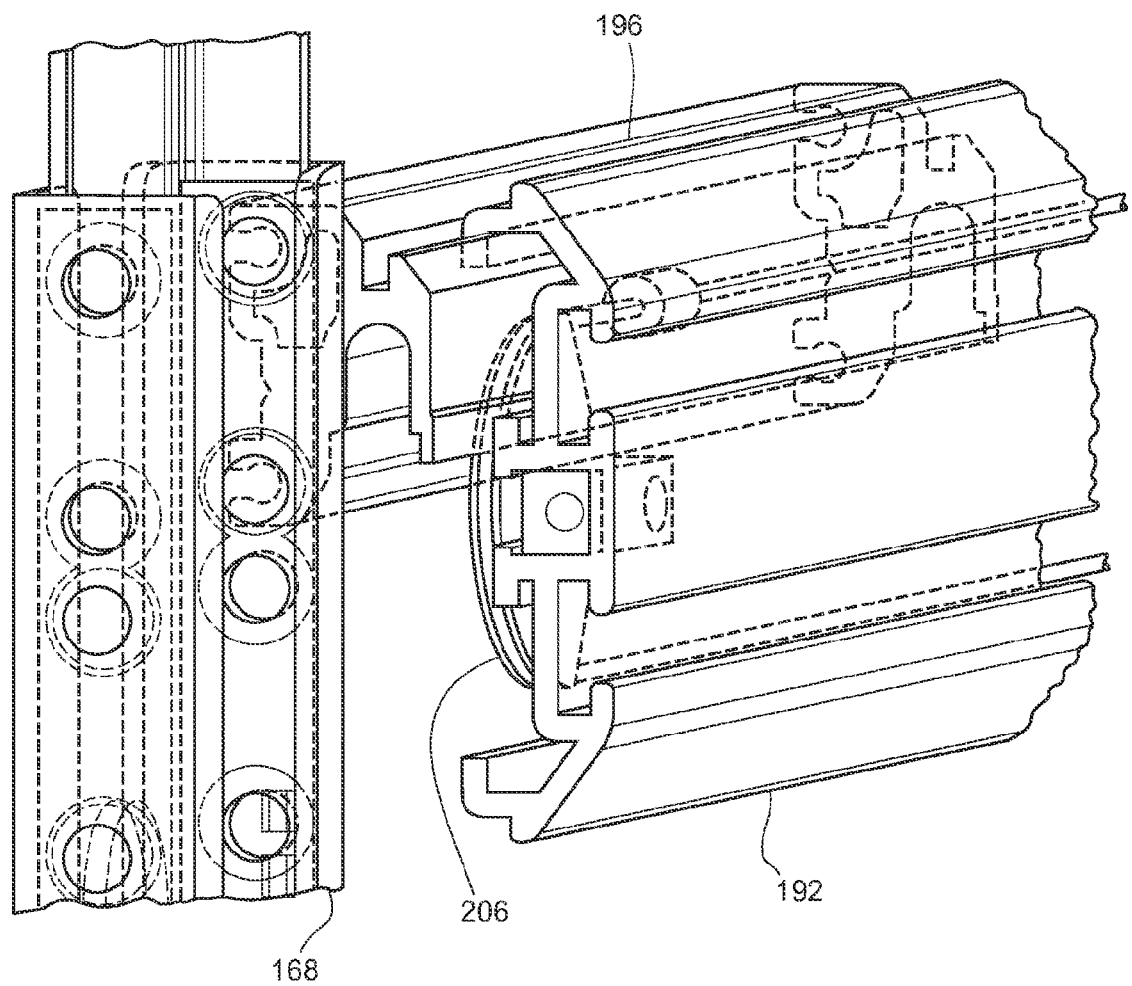

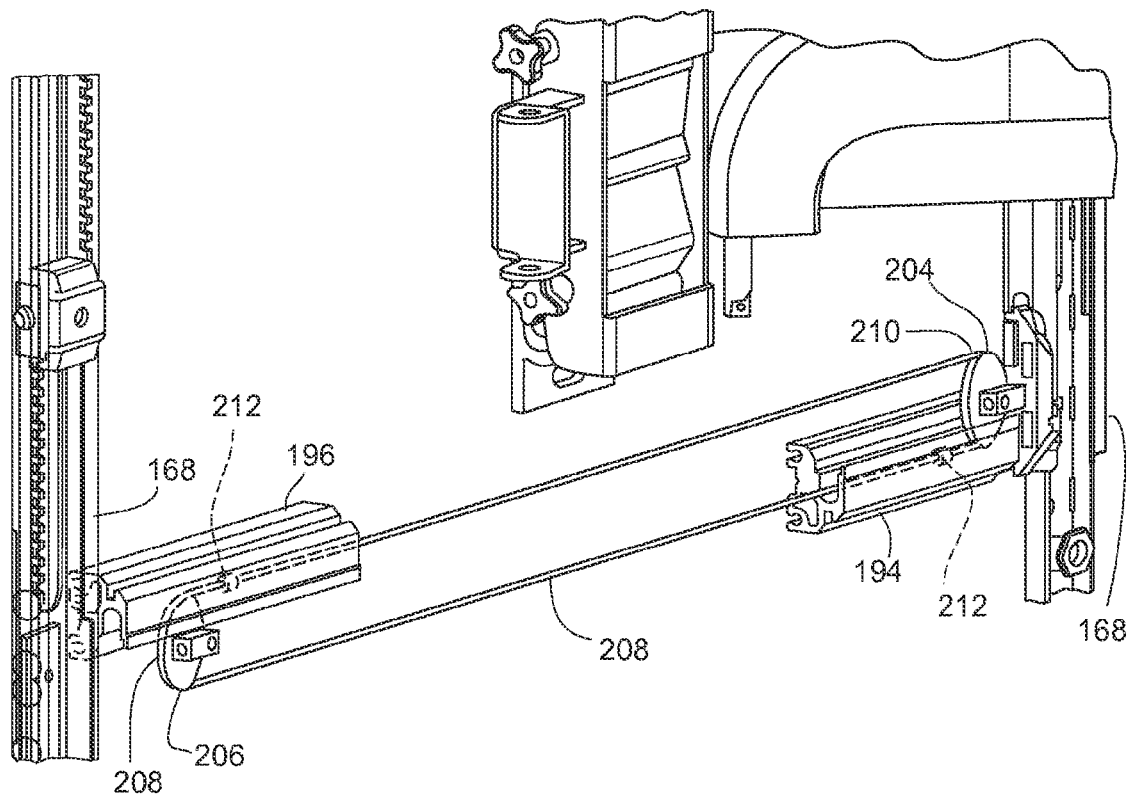

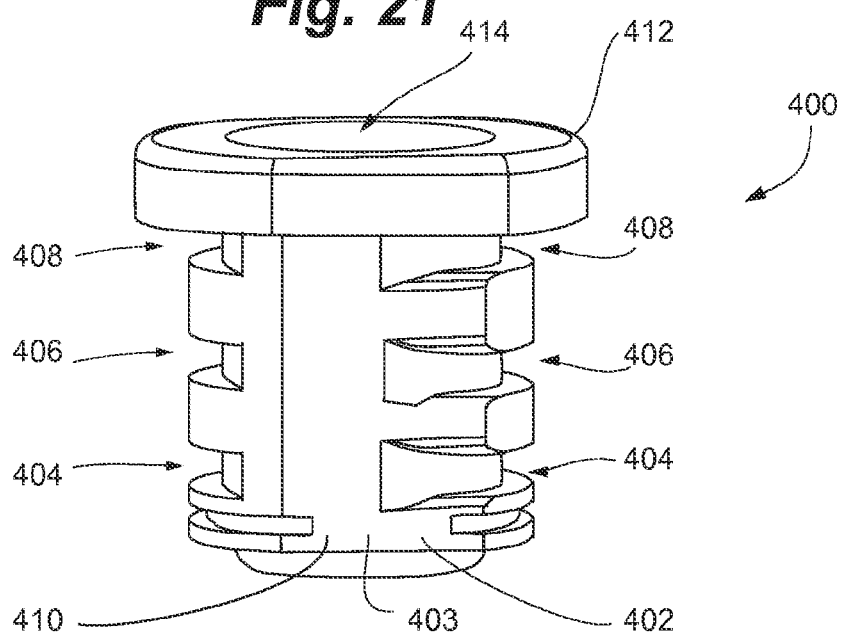
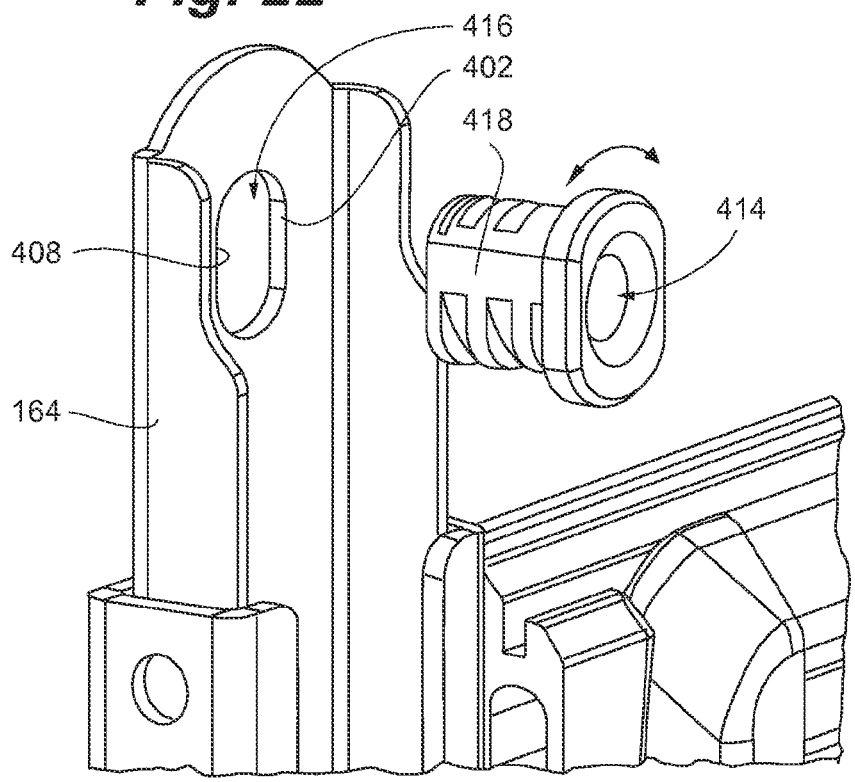

ARTICULATING MOUNT FOR FLAT PANEL DISPLAY

RELATED APPLICATIONS

This application is a National Phase entry of PCT Application No. PCT/US2013/032576 filed Mar. 15, 2013, which application claims the benefit of priority to U.S. Provisional Patent Application No. 61/709,916 filed Oct. 4, 2012, the entire disclosures of which are incorporated herein by reference.

FIELD OF THE INVENTION

The present invention relates to mounting flat panel electronic displays such as monitors and televisions on walls, and more specifically to mounts for flat panel electronic displays that enable selective positioning of the flat panel display relative to a wall.

BACKGROUND OF THE INVENTION

It is often desirable for purposes of convenience to mount flat panel displays such as computer monitors and televisions from a wall. Two persistent challenges in developing mounts for this purpose, however, are: (1) in making the mount as unobtrusive as possible; and (2) in making the mount as adaptable as possible so as to accommodate many different makes and models of displays, while also minimizing the number of parts that must be supplied with the mount.

While thin mounts have been developed that can be effectively concealed behind the display, appearance of the mount is a significant issue where the capability to position the display is desired. Especially where the capability to move the display away from the wall to enable side-to-side positioning is provided, the mount becomes more visible to users. Prior attempts at such full-motion mounts often have exposed brackets and wires, detracting from the aesthetics of the mount and the overall installation.

In addition, many different sizes, makes, and models, of displays are now available. While displays generally have designated mounting points for attaching a mount to the back of the display, the spacing of these mounting points varies, typically making it necessary to provide additional parts with each mount to enable the mount to be adapted to the display, or for mount manufacturers to have several different models, each adapted to mount different displays.

What is still needed in the industry is a full motion wall mount for flat panel display devices that has an attractive aesthetic appearance enabling effective concealment of wires, and that is readily adaptable to many different makes and models of displays.

SUMMARY OF THE INVENTION

A mount according to the present invention addresses the need of the industry for a full motion wall mount for flat panel display devices that has an attractive aesthetic appearance enabling effective concealment of wires, and that is readily adaptable to many different makes and models of displays.

According to an embodiment, a mounting system for an electronic display includes a wall interface, a display interface, and an arm assembly operably coupling the wall interface to the display interface. The display interface includes a pair of spaced-apart vertical mounting assemblies operably coupled by a pair of spaced-apart horizontal assemblies, the vertical mounting assemblies being shiftable relative to each other with the horizontal assemblies.

In some embodiments, each of the horizontal assemblies includes a center member, a first slider slidably shiftable on the center member, and a second slider slidably shiftable on the center member, the first slider being attached to one of the vertical mounting assemblies such that shifting the first slider on the center member shifts a horizontal position of the vertical mounting assembly relative to the center member, and the second slider being attached to the other of the vertical mounting assemblies, such that shifting the second slider on the center member shifts a horizontal position of the other vertical mounting assembly relative to the center member. At least one of the horizontal assemblies can include a coordinating mechanism operably coupling the first slider and the second slider, the coordinating mechanism arranged such that the first slider and the second slider shift the same distance relative to the center member when either of the first slider or the second slider is shifted on the center member. The coordinating assembly can be a cable operably coupled to the first slider and the second slider.

In further embodiments, each of the vertical mounting assemblies may include a center member and a pair of attachment members, the attachment members being slidably shiftable on the center member to alter a length of the vertical mounting assembly. At least one of the vertical mounting assemblies can include a coordinating mechanism operably coupling the attachment members such that the attachment members shift the same distance on the center member when either one of the attachment members is shifted on the center member.

In further embodiments, the wall interface can include a first member and a second member, the first member coupled to the second member with a hinge such that the wall interface is foldable.

In still further embodiments the arm assembly includes at least one arm having a first portion pivotally coupled to a second portion, the first portion comprising a pair of spaced apart members, each presenting a first end and an opposing second end, the first end of each of the spaced-apart members of the first portion pivotally coupled to the wall interface, the second end of each of the spaced-apart members pivotally coupled to a first end of the second portion, an opposing end of the second portion operably coupled to the display interface, the second portion of the arm being nestable between the spaced-apart members of the first portion when the arm is folded. The arm can define a continuous concealed channel for receiving wires extending from the first end of one of the spaced apart members of the first portion to the end of the second portion operably coupled to the display interface.

In still further embodiments, the display interface includes a tilt assembly arranged so as to tilt an electronic display attached to the display interface about a substantially horizontal tilt axis disposed forwardly from the display interface. The tilt assembly may enable selective shifting of a location of the horizontal tilt axis relative to the display interface.

In a further embodiment, an electronic display system includes an electronic display and a mount for attaching the electronic display to a wall. The mount includes a wall interface, a display interface, and an arm assembly operably coupling the wall interface to the display interface, the display interface including a pair of spaced-apart vertical mounting assemblies operably coupled by a pair of spaced-apart horizontal assemblies, the vertical mounting assemblies being shiftable relative to each other with the horizontal assemblies, the electronic display received on the vertical mounting assemblies. The mount may have any or all of the features elaborated herein.

BRIEF DESCRIPTION OF THE DRAWINGS

The embodiments of the present invention may be more completely understood in consideration of the following detailed description of various embodiments in connection with the accompanying drawings, in which:

FIG. 11 is an enlarged fragmentary view taken at the connection of a horizontal member and a vertical member of the display interface of FIG. 7, with portions of the horizontal and vertical members shown in phantom to reveal the internal cable assembly of the horizontal member;

FIG. 11a is an isometric view of the display interface assembly of the mount of FIG. 1, with some portions removed so as to better illustrate the coordinating assembly of the horizontal members;

FIG. 21 is an isometric view of an adjustable spacer according to an embodiment of the invention;

FIG. 22 is an exploded view depicting the insertion of the spacer of FIG. 21 in an aperture in an attachment member of the mount of FIG. 1;

Figure 1:
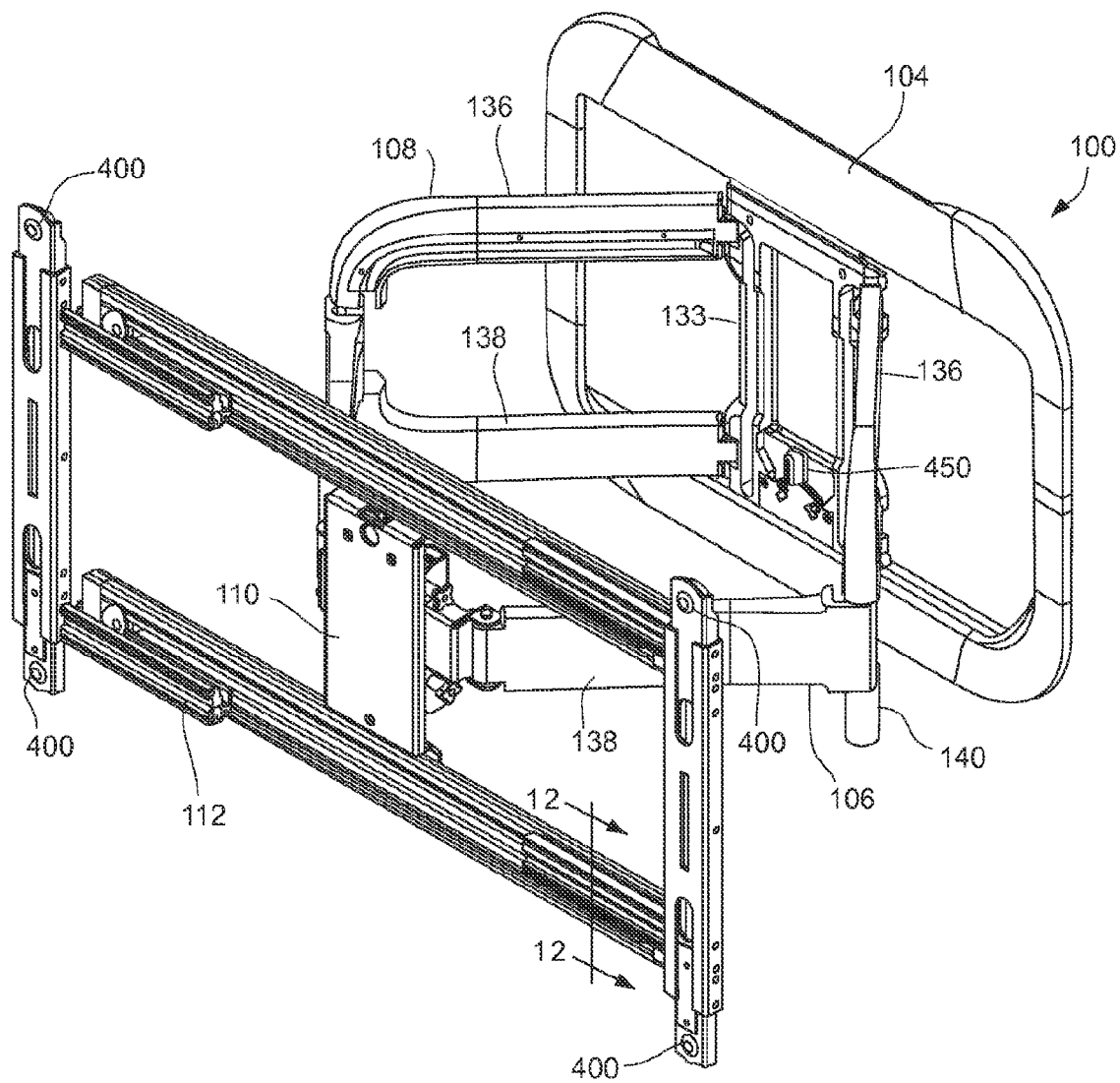
FIG. 1 is a front isometric view of a full-motion wall mount for a flat panel display according to an embodiment of the invention.

While the present invention is amenable to various modifications and alternative forms, specifics thereof have been shown by way of example in the drawings and will be described in detail. It should be understood, however, that the intention is not to limit the present invention to the particular embodiments described. On the contrary, the intention is to cover all modifications, equivalents, and alternatives falling within the spirit and scope of the present invention.

DETAILED DESCRIPTION

There is depicted in FIGS. 1-20 a mount 100 for a flat panel display 102 according to an embodiment of the present invention. Mount 100 generally includes wall plate assembly 104, arm assemblies 106, 108, tilt assembly 110, and display interface 112.

Figure 2:
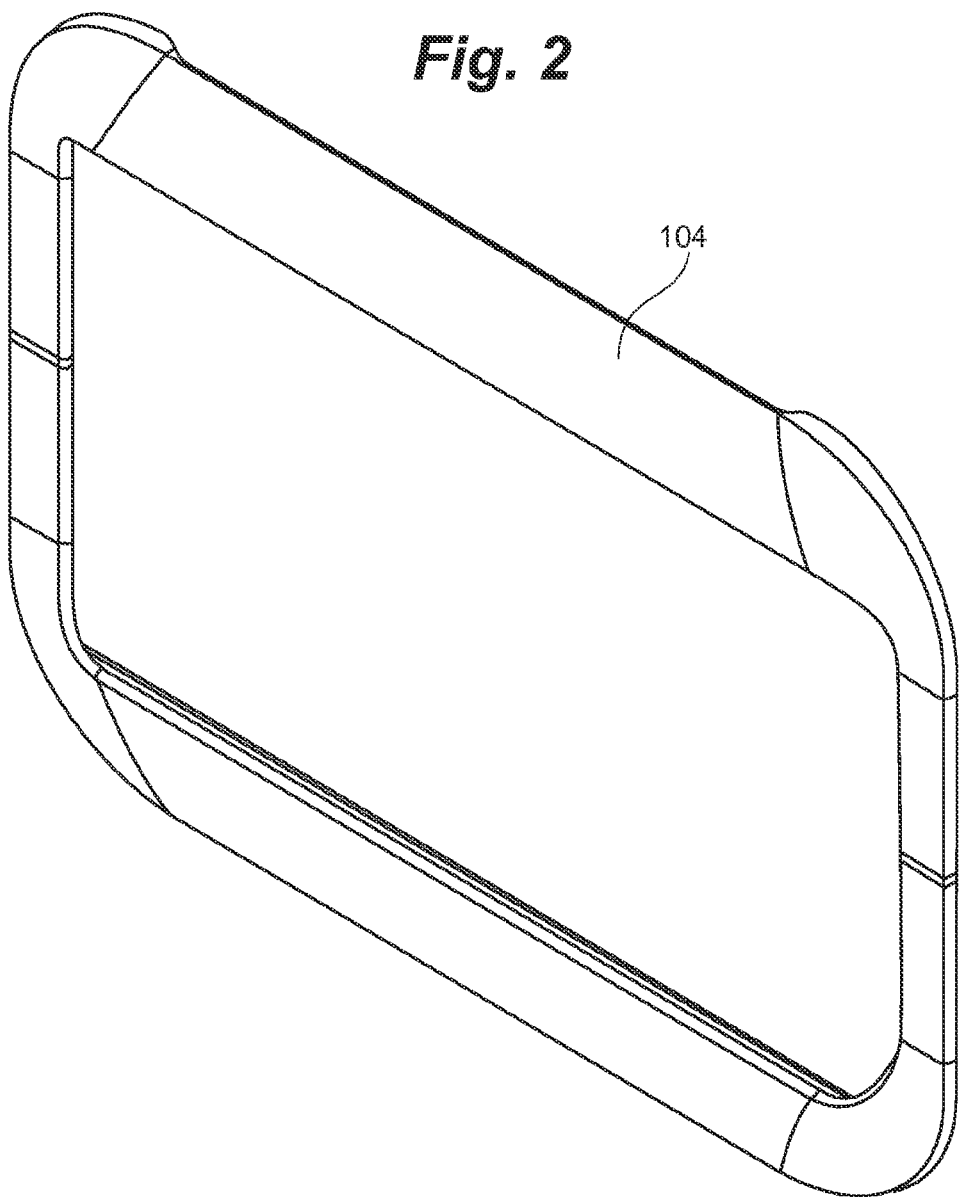
FIG. 2 is a front isometric view of the wall mounting plate of the mount of FIG. 1.
Figure 3:
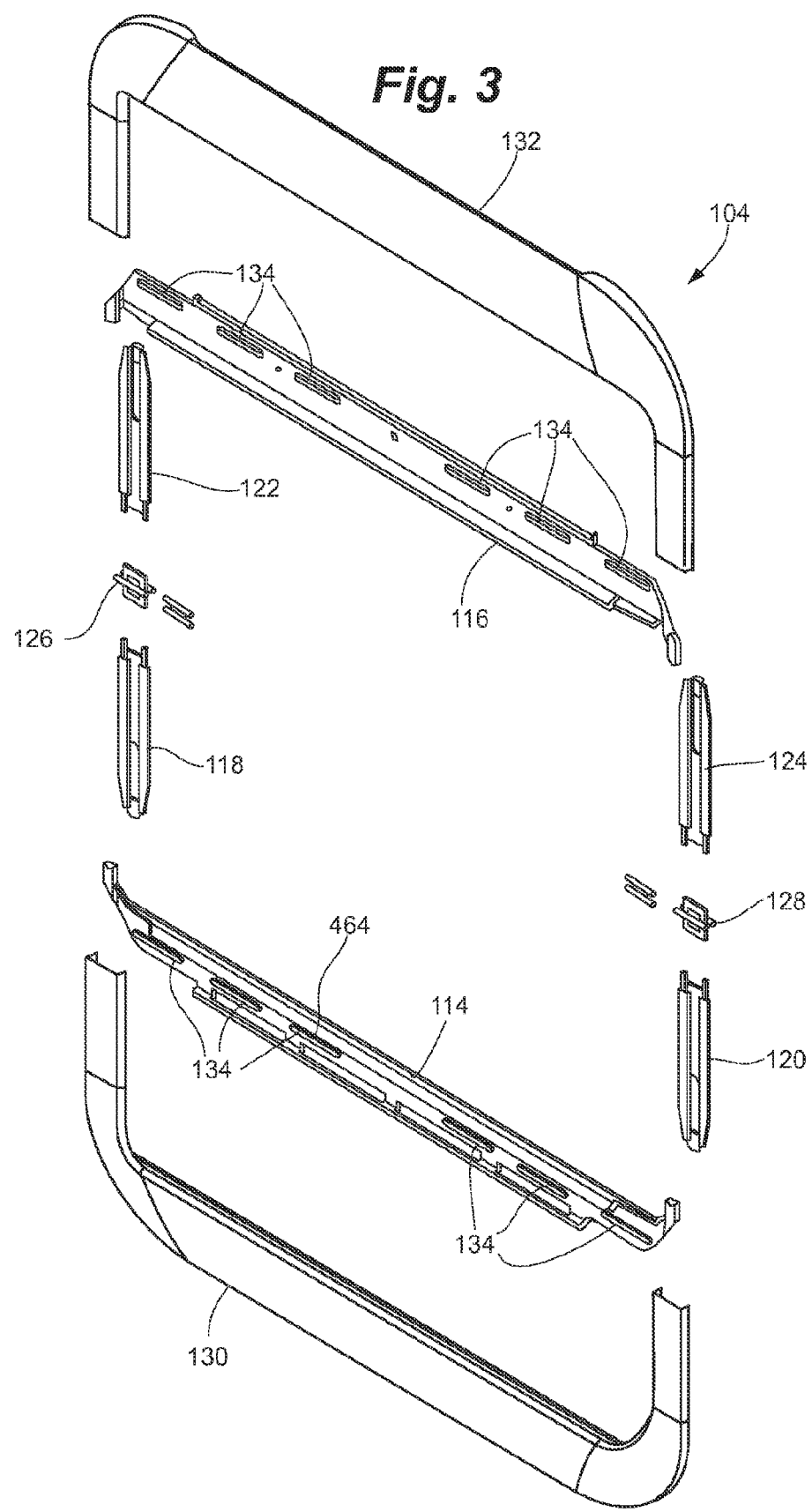
FIG. 3 is an exploded view of the wall plate of FIG. 2.

Wall plate assembly 104 as depicted in FIGS. 2 and 3 generally includes horizontal brackets 114, 116, lower vertical members 118, 120, upper vertical members 122, 124, hinges 126, 128, lower cover 130 and upper cover 132. Horizontal brackets 114, 116 define slots 134 for receiving fasteners (not depicted) to attach wall plate assembly 104 to a wall. Upper and lower vertical members 118, 120, 122, 124, connect horizontal brackets 114, 116, and are coupled together with hinges 126, 128, enabling the wall plate to fold up for ease of shipping. Once horizontal brackets 114, 116, are fastened in place on a wall, covers 130, 132 can be snapped in place to provide for an attractive appearance as depicted in FIG. 2. Arm attachment bracket 133 extends between horizontal brackets 114, 116, and is horizontally shiftable along them to alter the horizontal position of the arm assemblies 106, 108.

Figure 4:
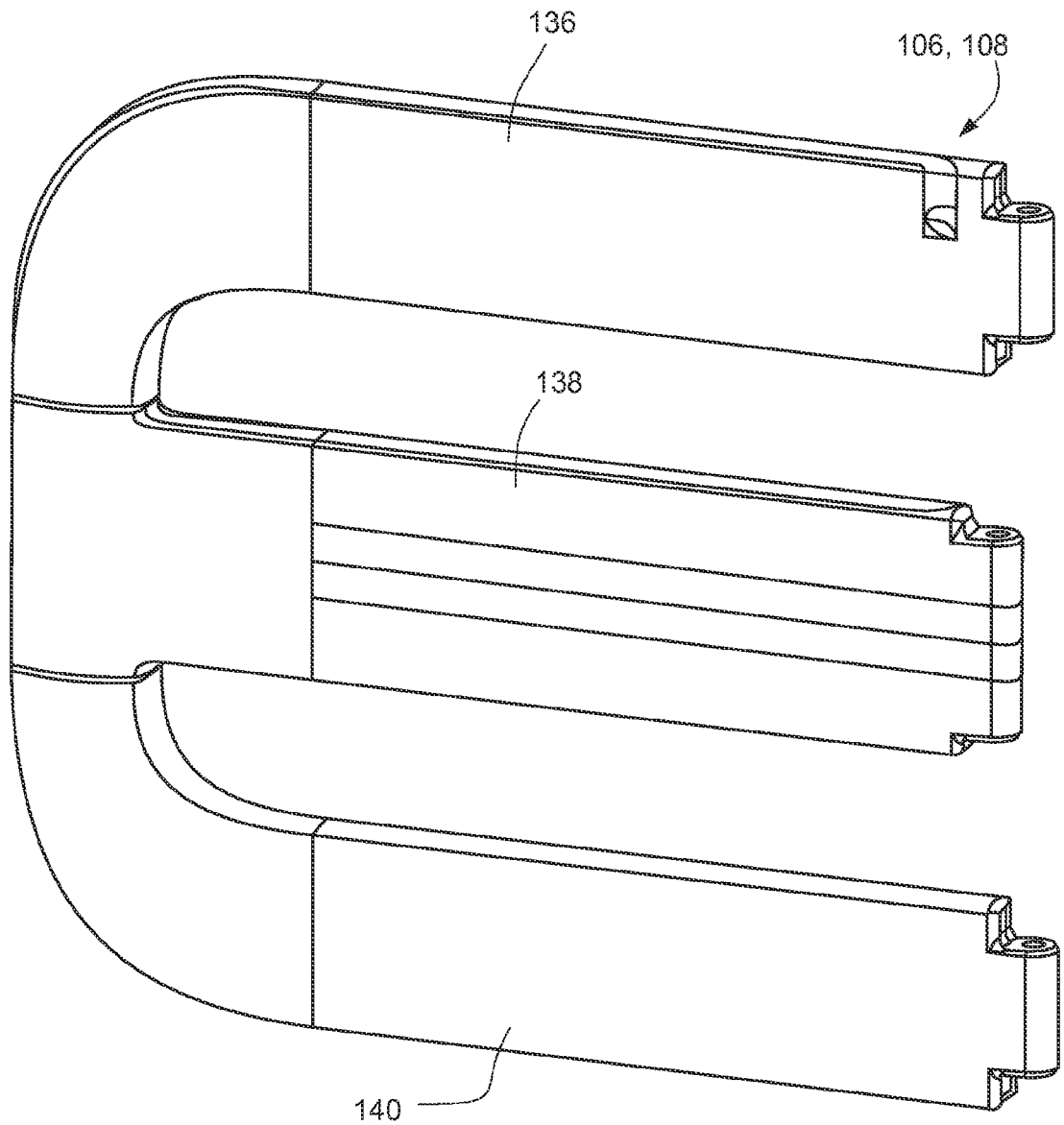
FIG. 4 is an isometric view of an arm assembly of the mount of FIG. 1.
Figure 5:
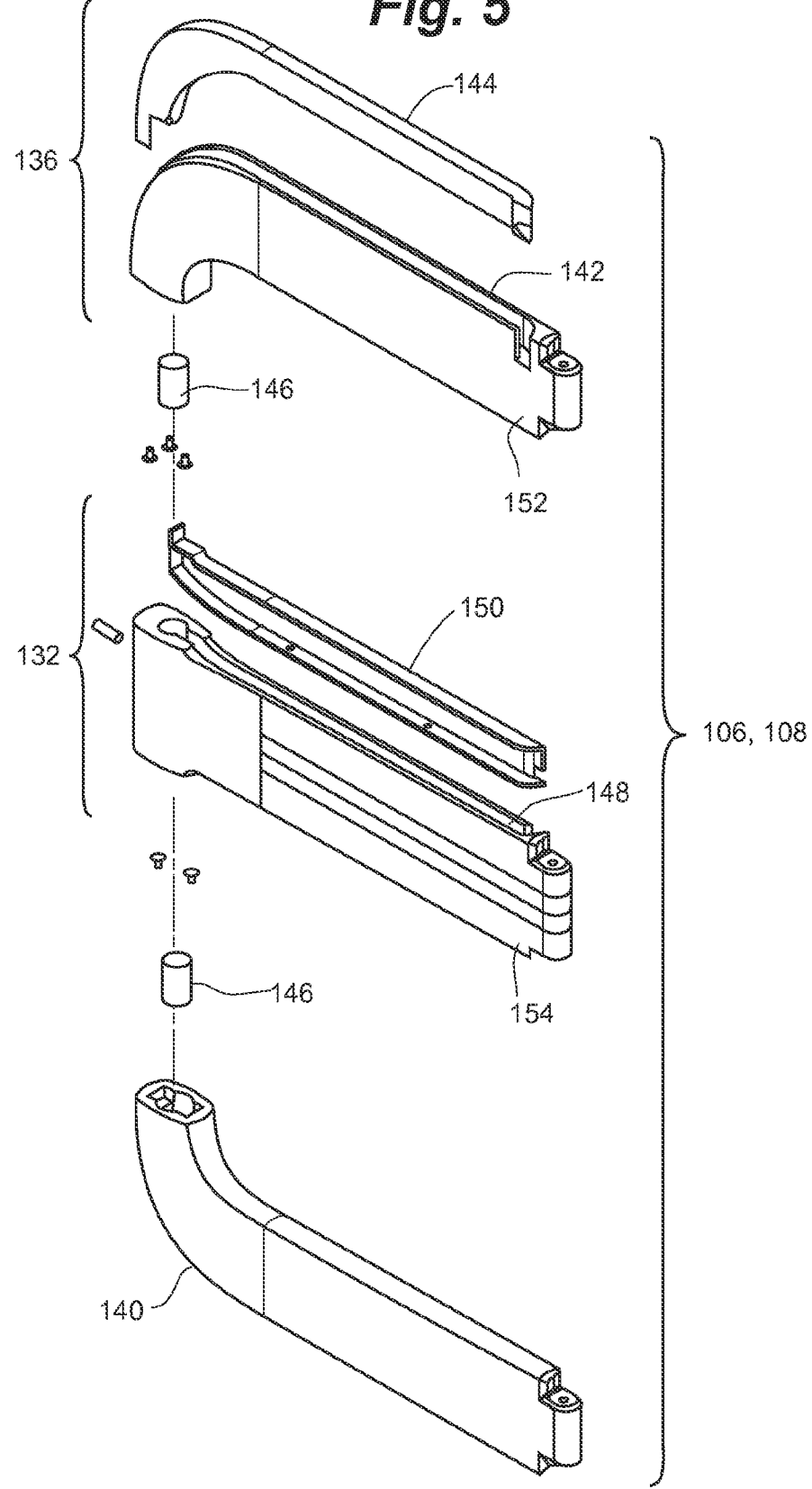
FIG. 5 is an exploded view of the arm assembly of FIG. 4.
Figure 6:
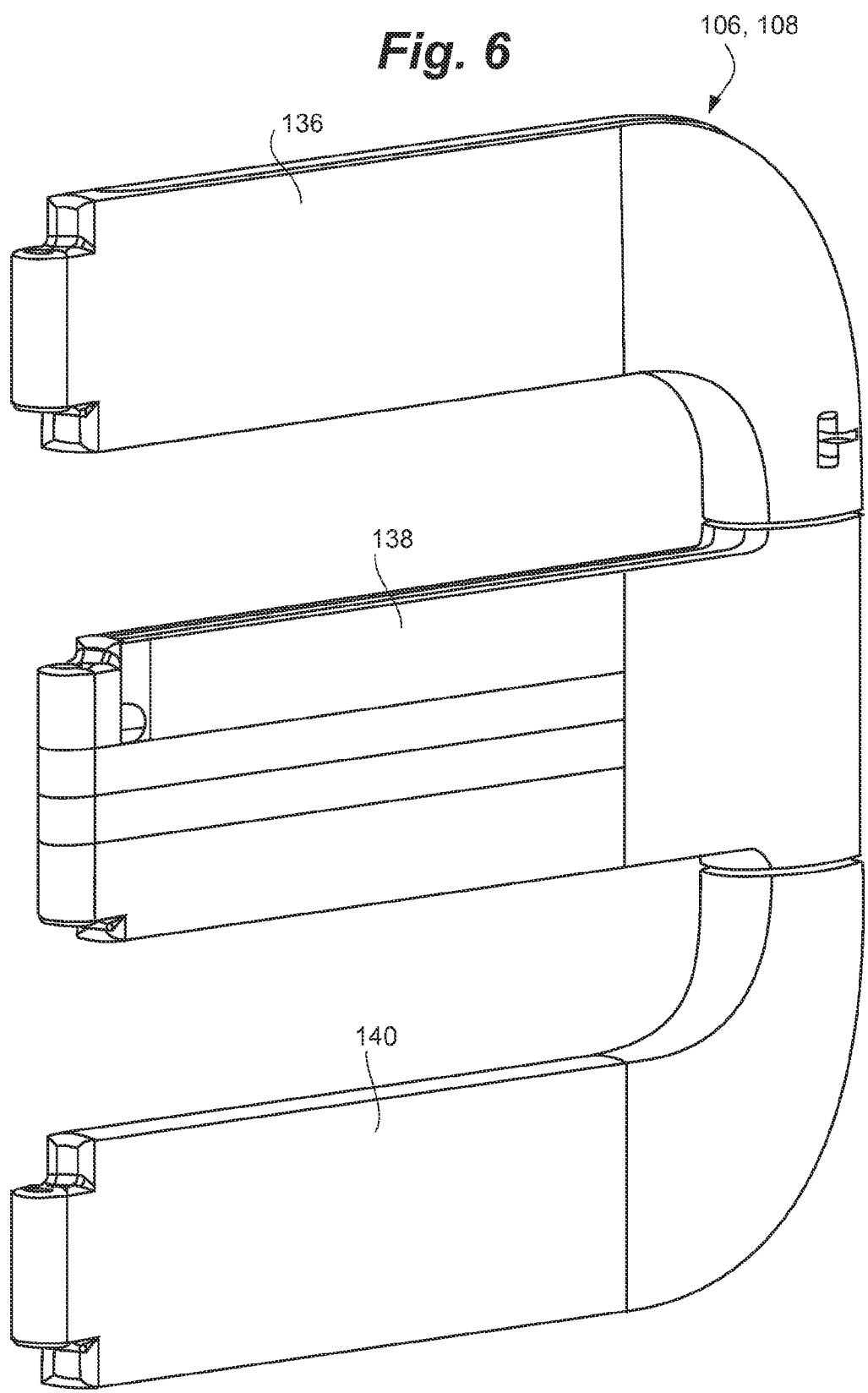
FIG. 6 is an isometric view of the opposite side of the arm assembly of FIG. 4.
Figure 19:
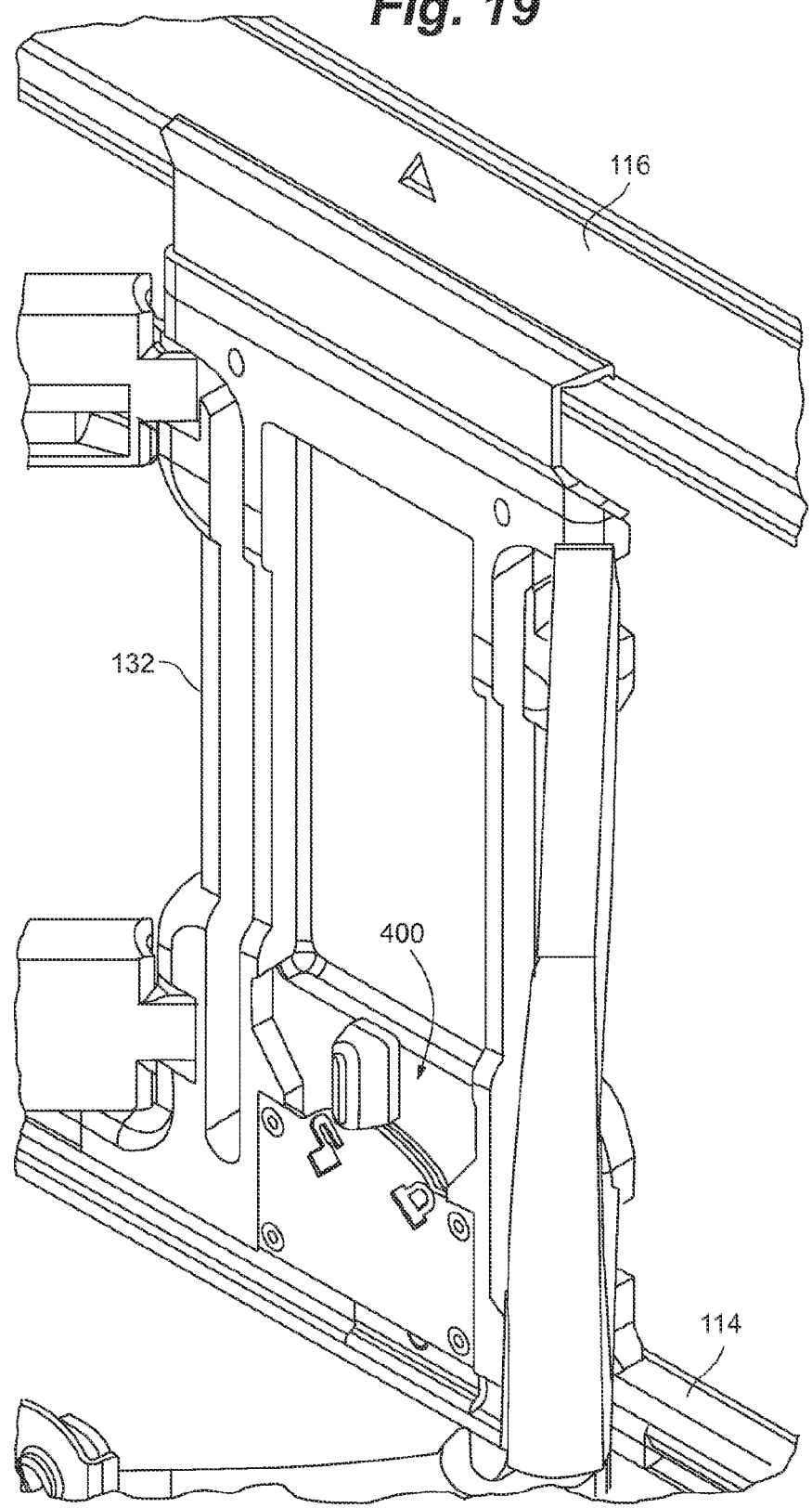
FIG. 19 is an isometric view of the arm mount assembly of the wall plate of FIG. 2.

Arm assemblies 106, 108, as depicted in FIGS. 4-6, are essentially identical and generally include upper member 136, center member 138, and lower member 140. Upper member 136 defines channel 142, which receives wire management member 144. Center member 138 is pivotally attached to upper member 136 and lower member 140 with pivot pins 146 to enable arm assemblies 106, 108, to articulate as depicted in FIG. 1. Center member 138 defines channel 148, which receives wire management member 150. Wire management members 144, 150, can provide a continuous concealed channel extending from proximal end 152 of upper member 136 to distal end 154 of center member 138 in which wires (power, signal, etc.) for display 102 can be disposed. Each arm assembly 106, 108, is pivotally attached to arm attachment bracket 133 as depicted in FIG. 19.

Figure 10:
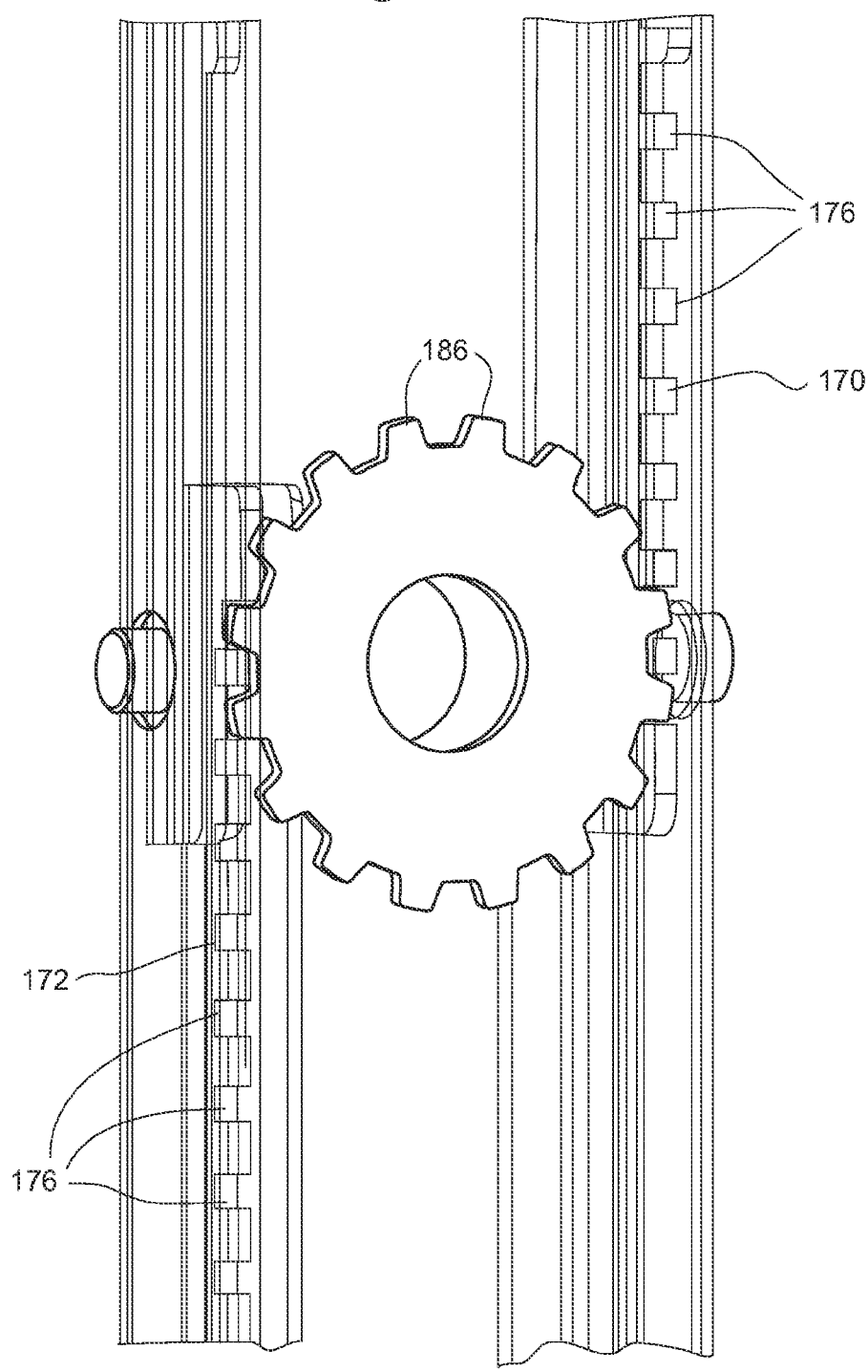
FIG. 10 is an enlarged fragmentary view of a gear assembly in a vertical member of the display interface of FIG. 7, with some portions of the member shown in phantom for clarity.

Display interface 112 is depicted in FIGS. 7-12, and generally includes vertical assemblies 156, 158, and horizontal assemblies 160, 162. Each vertical assembly 156, 158, generally includes upper attachment member 164, lower attachment member 166, center member 168, slide bars 170, 172, and coordinating gear assembly 174. Slide bar 170 is coupled to upper attachment member 164, and slide bar 172 is coupled to lower attachment member 166. Slide bars 170, 172 are slidably received in opposite sides of center member 168, and each define a series of notches or apertures 176 as depicted in FIG. 10. Upper attachment member 164 and lower attachment member 166 define apertures 177 to receive fasteners 179 to attach display interface 112 to the rear side of display 102.

Figure 10A:
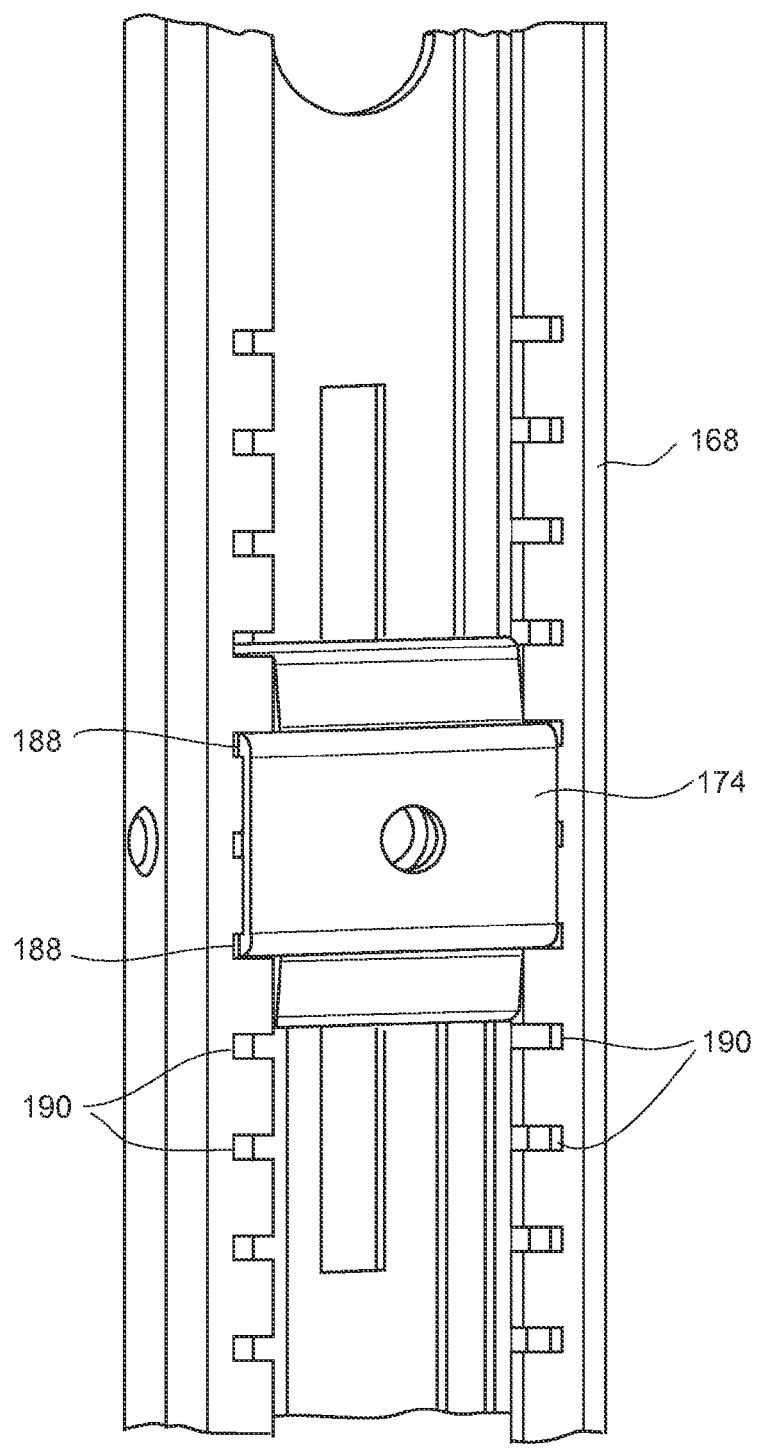
FIG. 10a is an enlarged rear isometric view of the gear assembly of FIG. 10 received in the center member of the vertical member of the display interface.
Figure 12:
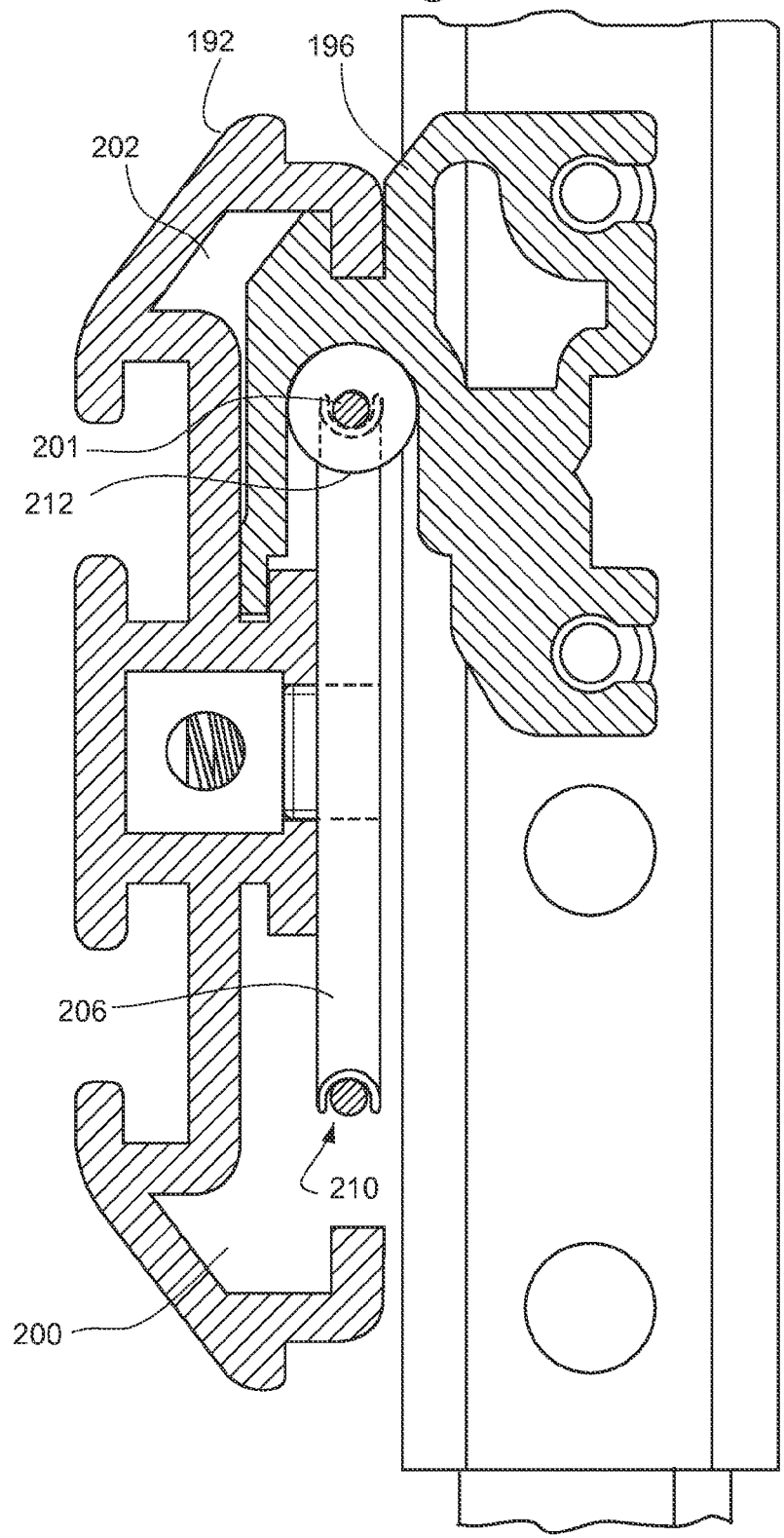
FIG. 12 is a cross-section taken at section 12-12 of FIG. 7.
Figure 13:
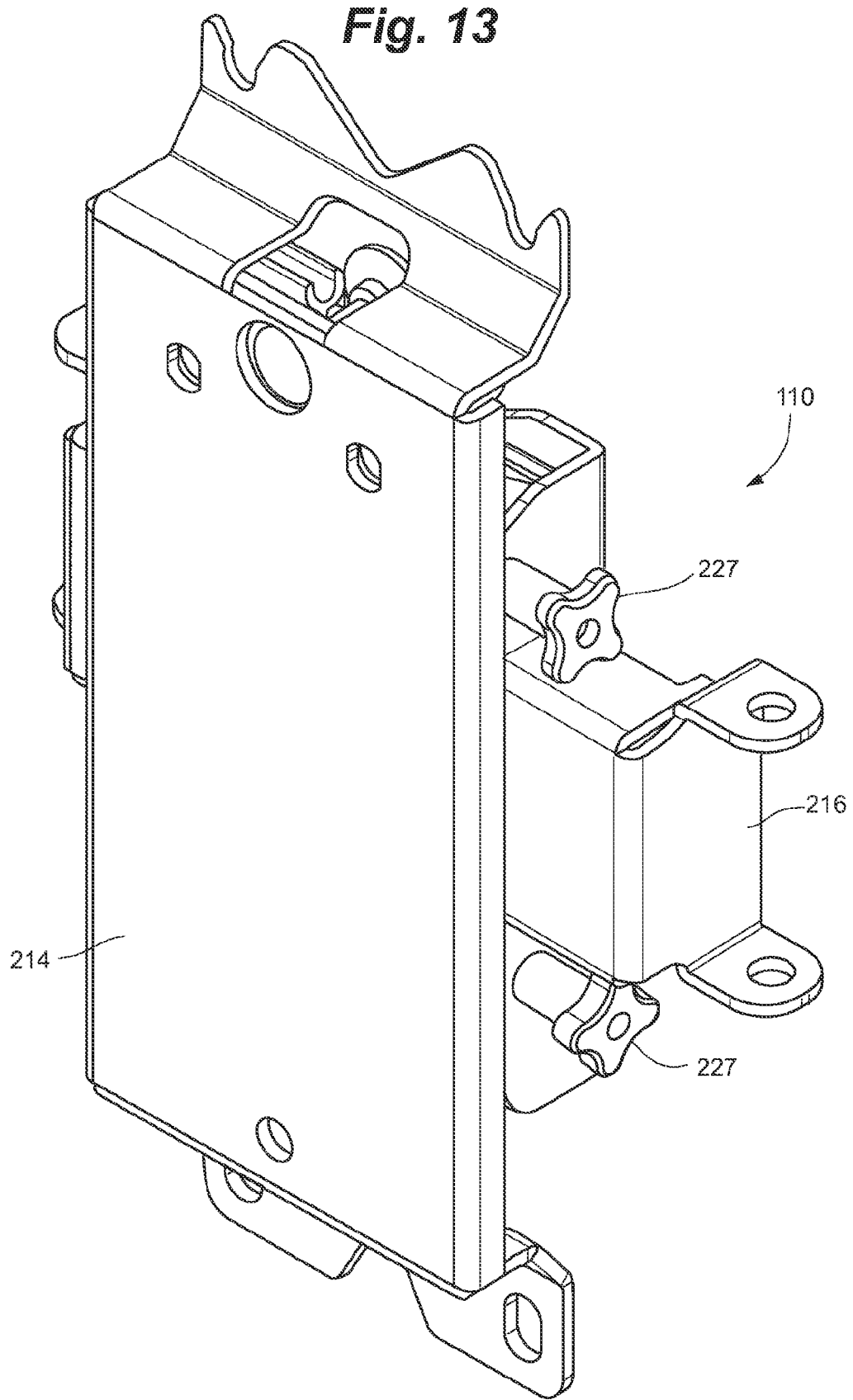
FIG. 13 is a front isometric view of the display tilt assembly of the mount of FIG. 1.
Figure 14:
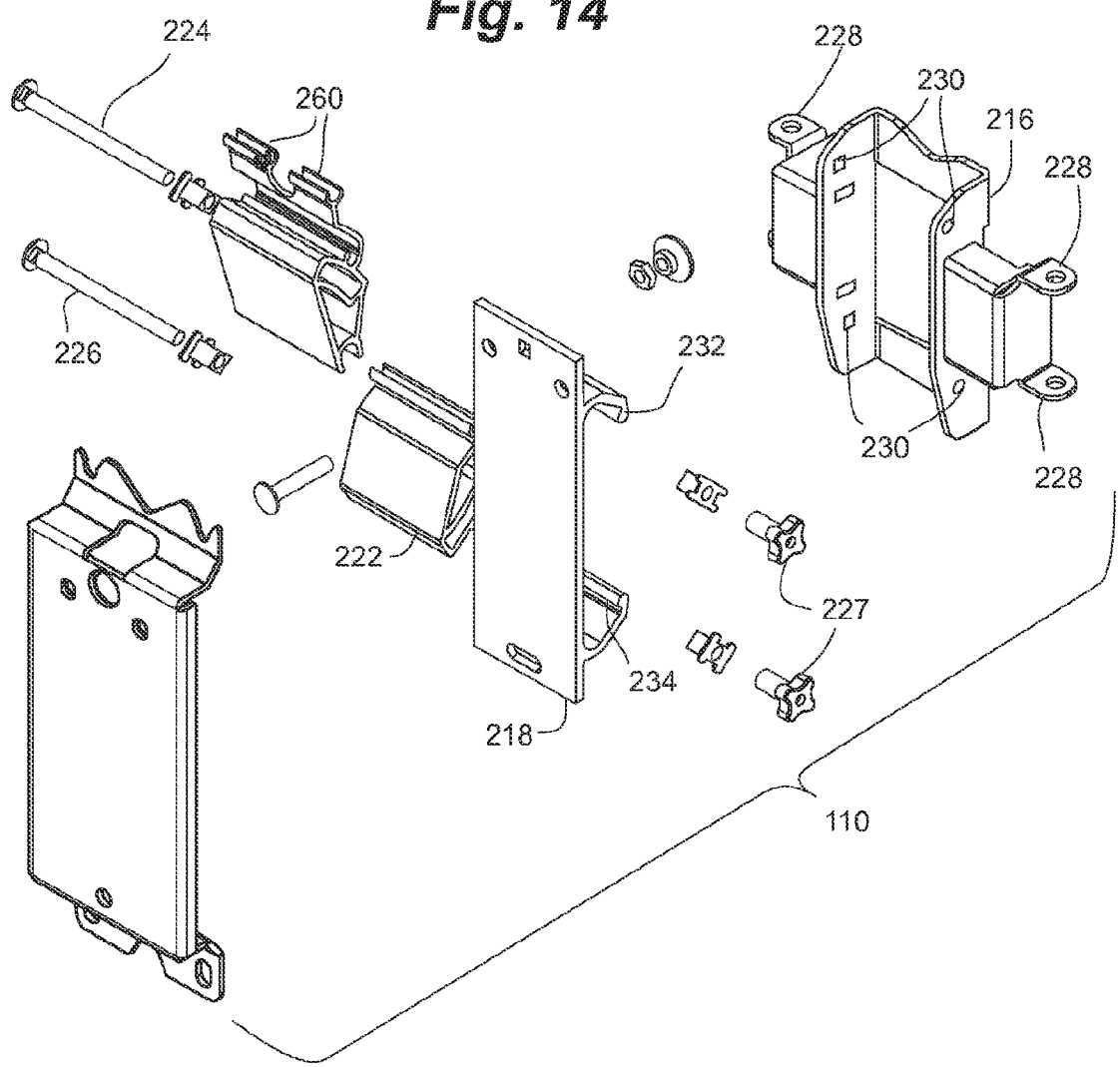
FIG. 14 is an exploded view of the display tilt assembly of FIG. 13.

Coordinating gear assembly 174 generally includes coupler 178, bearing block 180, gear 182 and bushing 184. Gear 182 is rotatably attached to bearing block 180 with bushing 184. Gear 182 defines teeth 186. Gear assembly 174 is received in center member 168 and is held in place by the engagement of the inwardly turned edges 188 of the coupler 178 in notches 190 in center member 168 as depicted in FIG. 10a. It will be appreciated that the relative position of gear assembly 174 in center member 168 can be altered by engaging the coupler with different pairs of the notches 190. As depicted in FIG. 10, teeth 186 of gear 182 engage in apertures 176 of the slide bars 170, 172.

In use, upper attachment member 164 and lower attachment member 166 can be advanced toward or away from center member 168 in order to adjust the vertical spacing of fasteners 179 in order to accommodate the spacing of attachment points for different makes and models of display 102. As the slide bars 170, 172, coupled with upper attachment member 164 and lower attachment member 166 respectively, slide in center member 168, gear 182 rotates due to the engagement of teeth 186 in apertures 176, and ensures that upper attachment member 164 and lower attachment member 166 are coordinated and advance the same distance.

Figure 7:
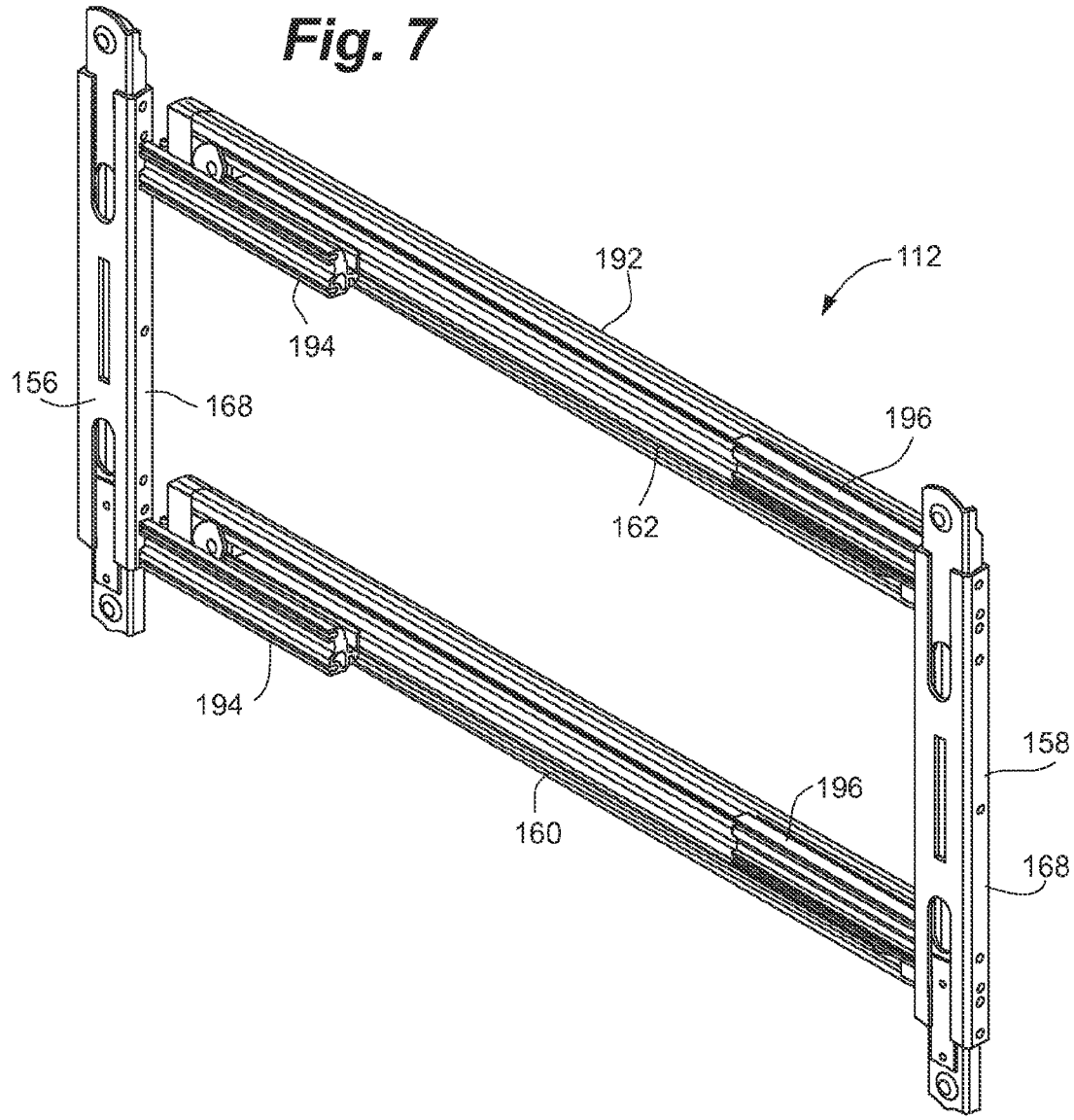
FIG. 7 is an isometric view of the display interface of the mount of FIG. 1.
Figure 8:
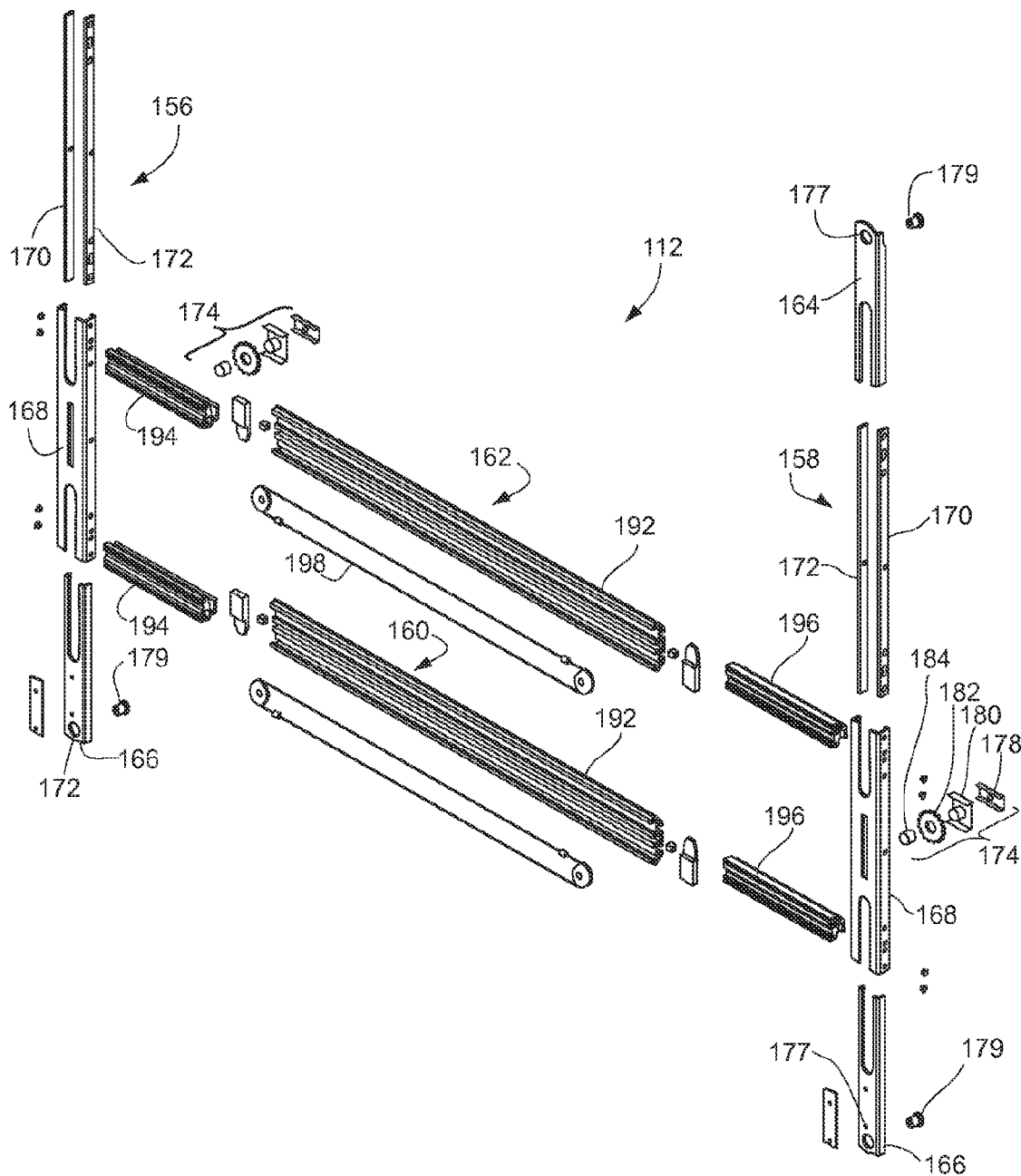
FIG. 8 is an exploded view of the display interface of FIG. 7.
Figure 9:
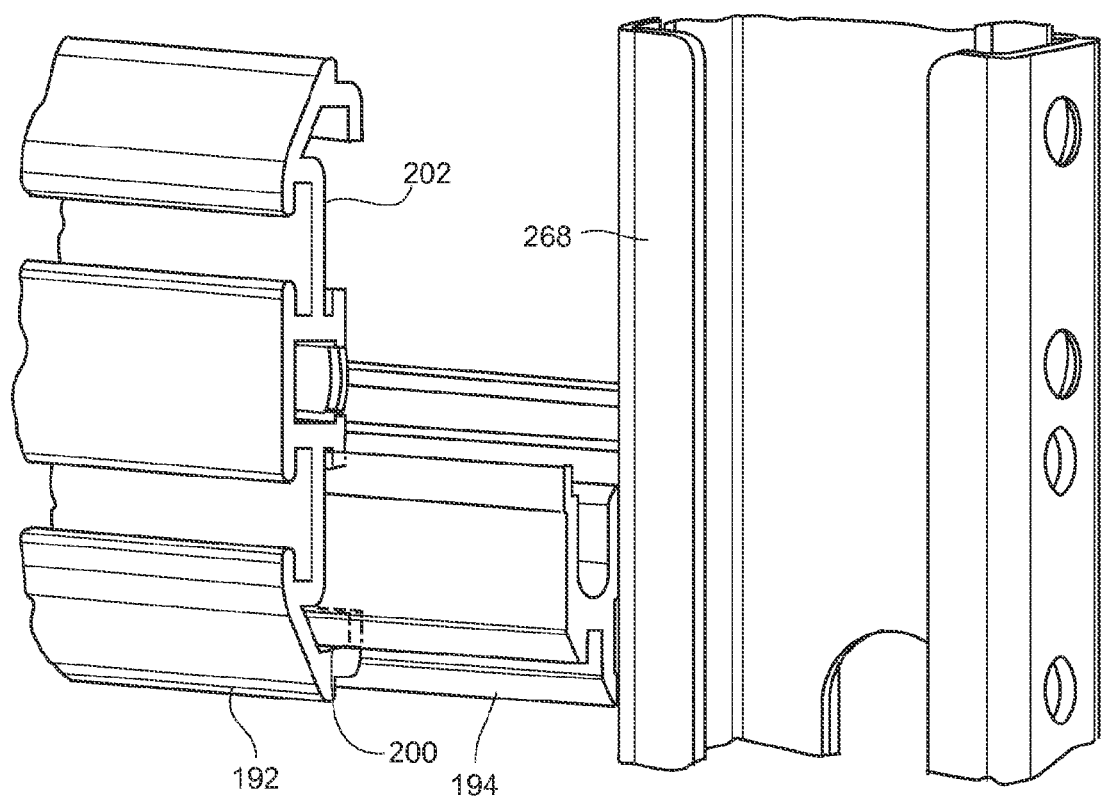
FIG. 9 is an enlarged fragmentary view taken at the connection of a horizontal member and a vertical member of the display interface of FIG. 7.

Horizontal assemblies 160, 162, each generally include center member 192, first slider 194, second slider 196, and coordinating assembly 198. Center member 192 defines channels 200, 202, in which first slider 194 and second slider 196 are slidably received, respectively. First slider 194 and second slider 196 are affixed to the center members 168 of the vertical assemblies 156, 158, as depicted in FIG. 7.

Coordinating assembly 198 generally includes guides 204, 206, and cable 208. Guides 204, 206, are attached to center member 192 with cable 208 slidably received in groove 210 in each. Buttons 212 are coupled to first slider 194 and second slider 196.

In use, first slider 194 and second slider 196 can be slid along center member 192 to advance vertical assemblies 156, 158, toward or away from center member 192, to thereby adjust the horizontal spacing of fasteners 179 in order to accommodate the spacing of attachment points for different makes and models of display 102. As the first slider 194 and second slider 196 move, cable 208 coordinates their movement and ensures that vertical assemblies 156, 158, move the same distance.

Tilt assembly 110 is depicted in FIGS. 13-16, and generally includes interface bracket 214, arm bracket 216, tilt plate 218, upper guide 220, lower guide 222, and guide pins 224, 226. Interface bracket extends between and is attached to center members 192 of each of horizontal assemblies 160, 162 as depicted in FIG. 1. Arm bracket 216 is pivotally coupled to center members 138 of arm assemblies 106, 108, with pivot pins (not depicted) extending through apertures 228. Guide pins 224, 226, extend through apertures 230 and are held in place with knobs 227. Tilt plate 218 is attached to interface bracket 214.

Figure 15:
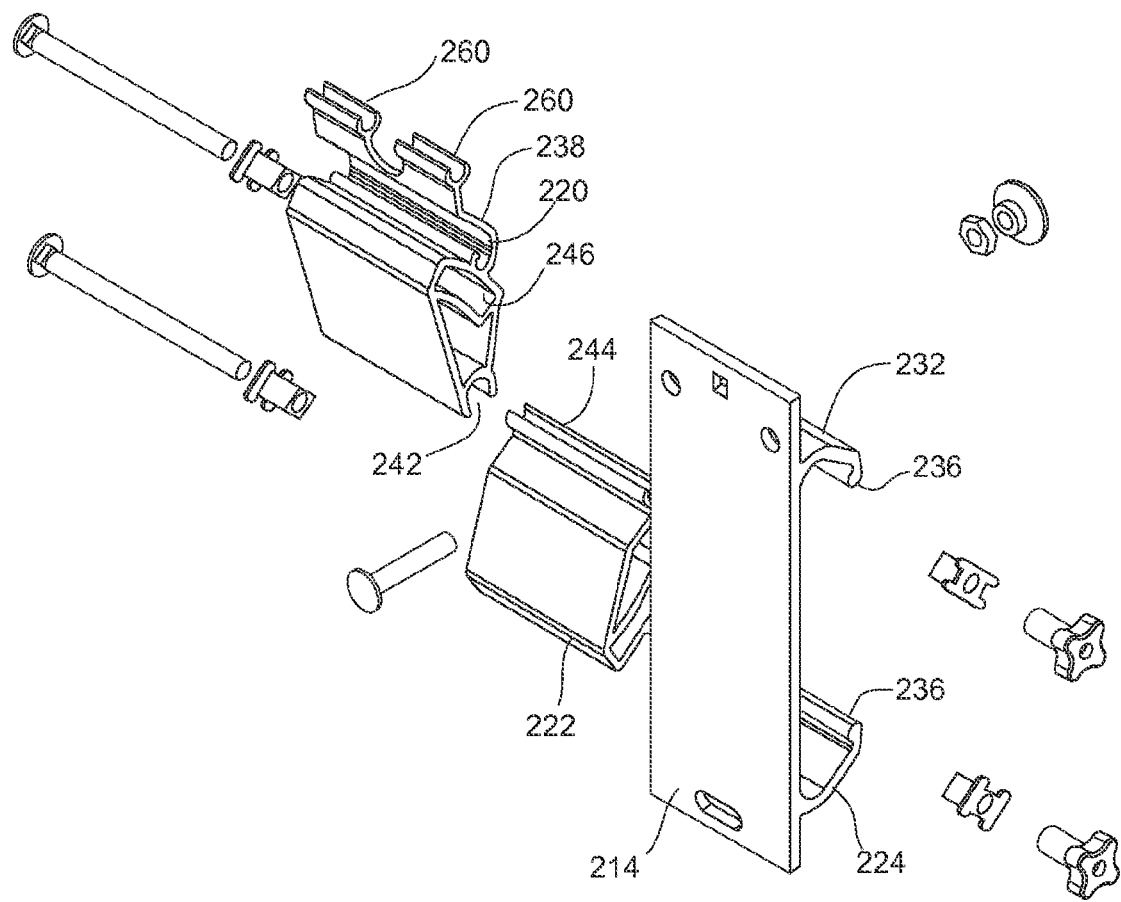
FIG. 15 is an enlarged exploded view of the adjustable tilt axis portion of the display tilt assembly of FIG. 13.
Figure 15A:
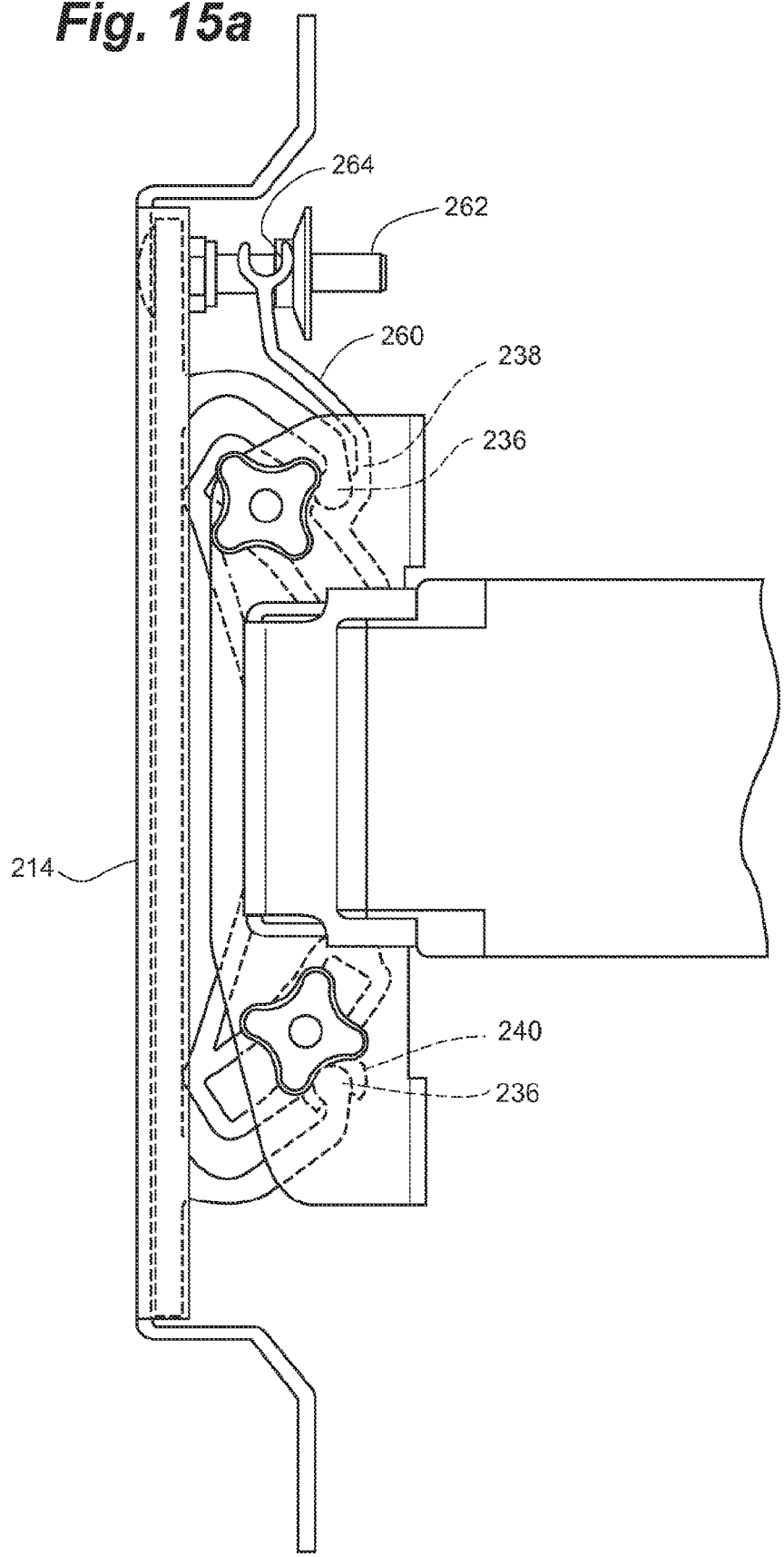
FIG. 15a is a side elevation view of the display tilt assembly of FIG. 13, with a portion of the assembly shown in phantom for clarity.
Figure 16:
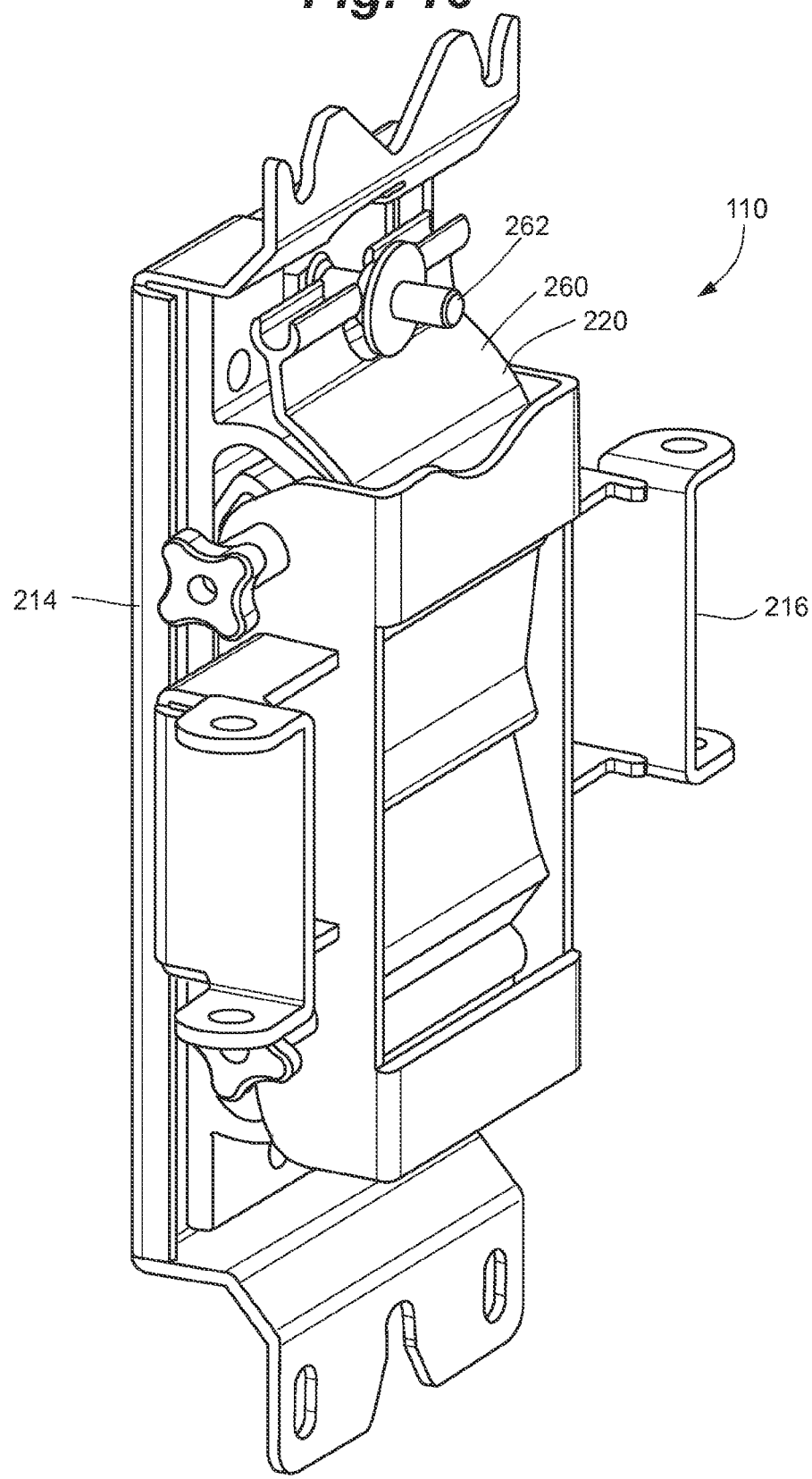
FIG. 16 is a rear isometric view of the display tilt assembly of FIG. 13.

Tilt plate 218 has inwardly curved members 232, 234, extending from its rear side, each member 232, 234, having a bulbous lip 236 at its distal end. Upper guide 220 and lower guide 222 define outwardly facing channels 238, 240, respectively, which are conformingly shaped to receive the bulbous lips 236 of members 232, 234 as depicted in FIG. 15a. Upper guide 220 defines channel 242, which receives conformingly shaped lip 244 of lower guide 222, thereby forming a pivoting connection between upper guide 220 and lower guide 222. Upper guide 220 defines slot 246 through which guide pin 224 is slidably received, and lower guide 222 defines slot 248 through which guide pin 226 is slidably received. Upper guide 220 further has flange 260 extending upwardly from its upper edge.

Figure 20:
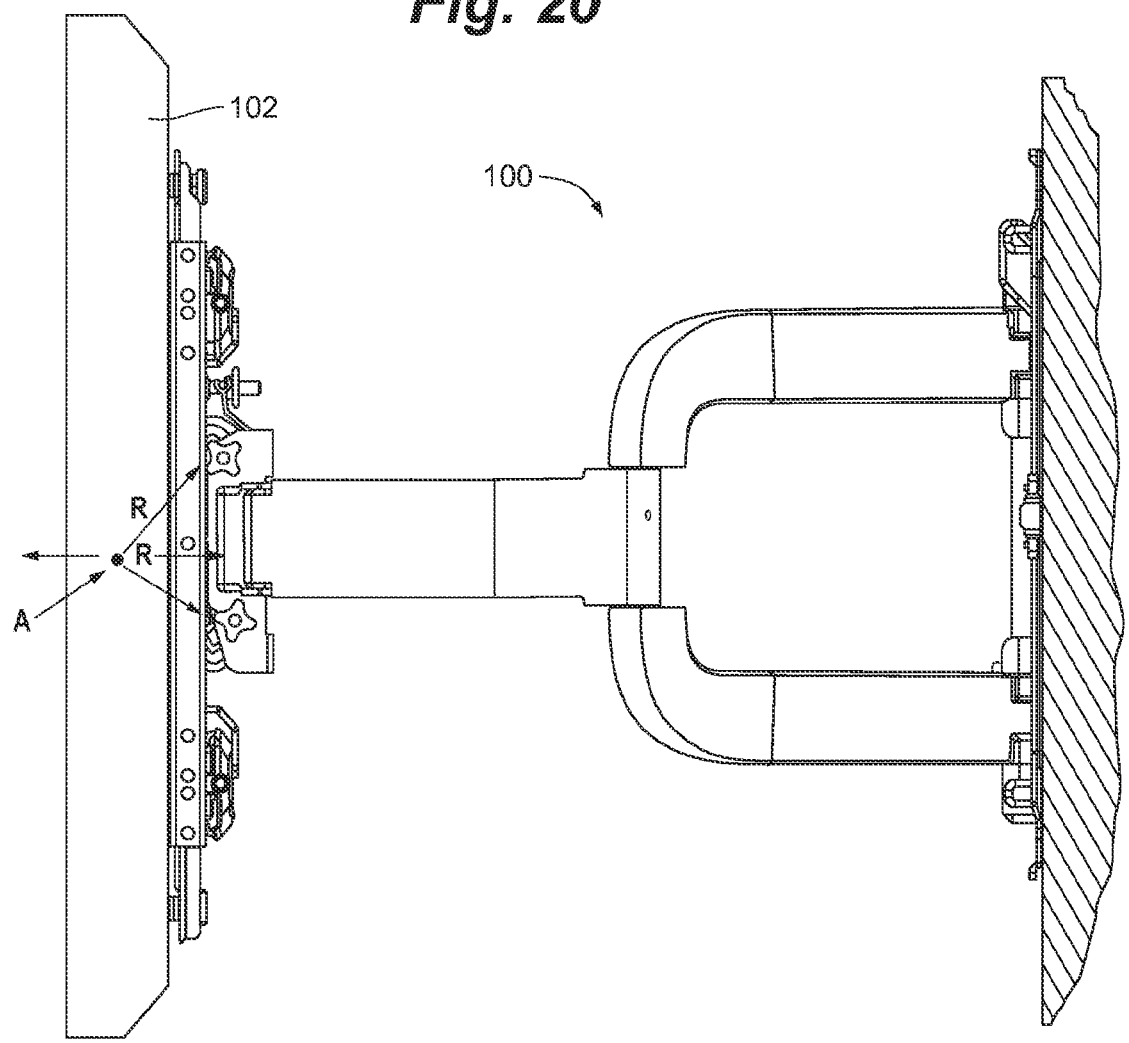
FIG. 20 is a side elevation view of the mount of FIG. 1.
Figure 23:
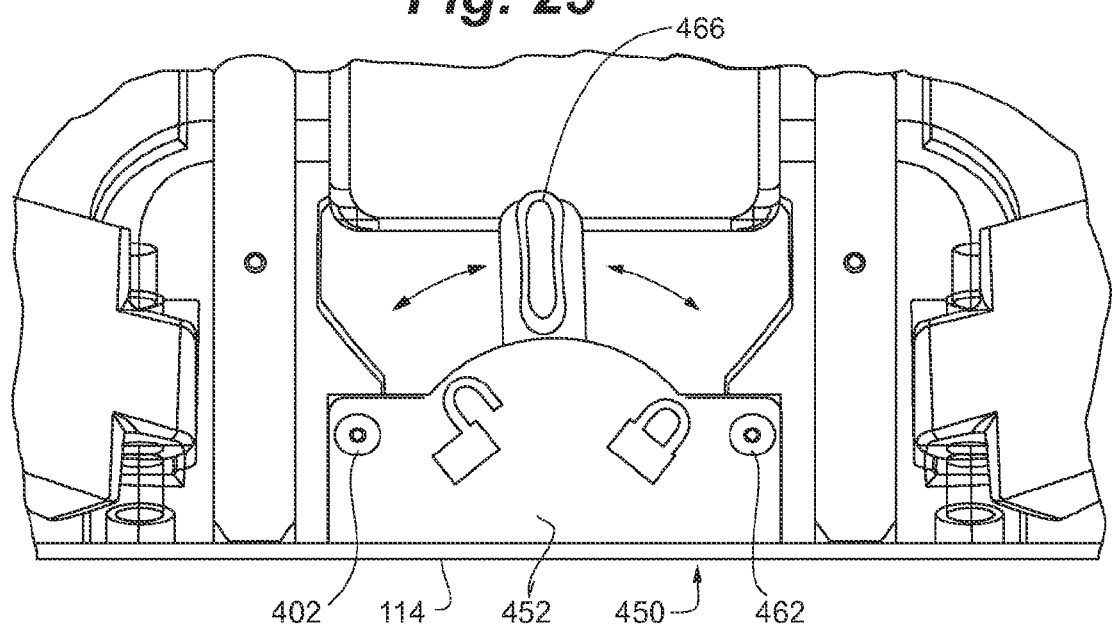
FIG. 23 is a front elevation view of a coupling mechanism for the arm attachment bracket of the mount of FIG. 1.
Figure 24:
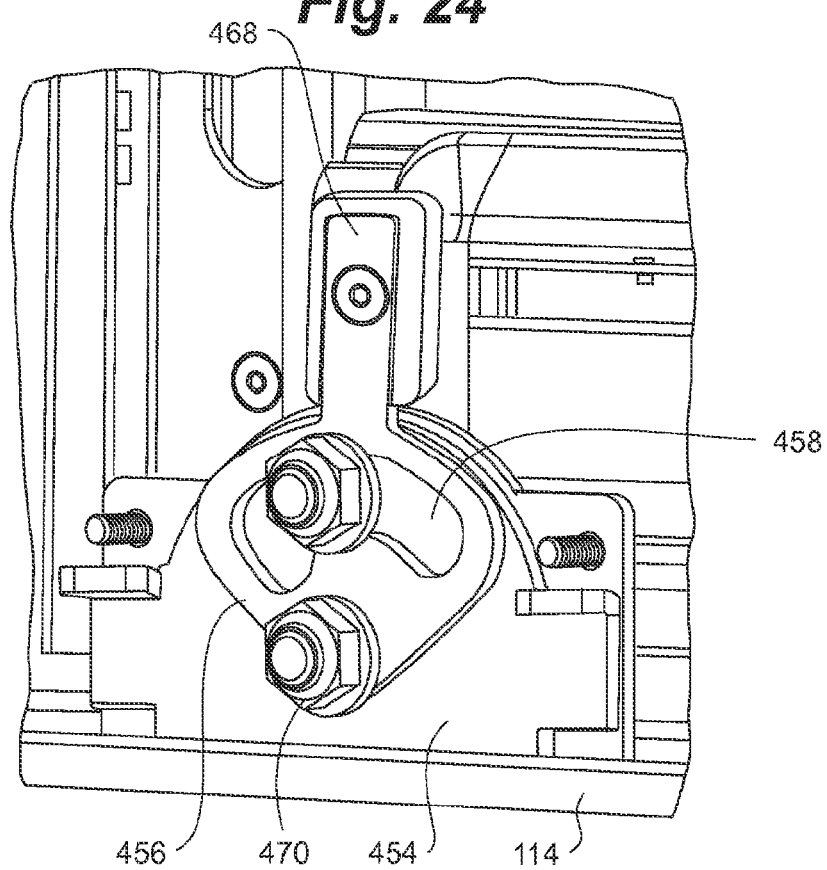
FIG. 24 is a rear isometric view of the coupling mechanism of FIG. 23, with portions removed for clarity.

It will be appreciated that the structure of tilt assembly 110 enables selective tilting of display 102 about a horizontal axis A positioned outwardly from interface bracket 214 as depicted in FIG. 20, through the sliding of guide pins 224, 226, in slots 246, 248 respectively. This tilting motion is further described in U.S. Pat. No. 6,905,101, owned by the owners of the present invention and hereby fully incorporated by reference.

Moreover, it will be appreciated that the position of axis A relative to interface bracket 214 can be altered. Flange 260 is coupled with adjustment bolt 262. When adjustment bolt 262 is rotated, end 264 of flange 260 is shifted relative to interface bracket 214. As end 264 shifts, upper guide 220 is pivoted, and through the pivoting connection of upper guide 220 with lower guide 222, lower guide 222 is shifted a corresponding amount. The pivoting of upper guide 220 and lower guide 222 shifts the orientation of slots 246, 248, thereby altering the radius of the circular arc along which the slots 246, 248, lie, and shifting the tilt axis A, which lies at the center of the arc, toward or away from the interface bracket 214. This aspect of the invention is further described in U.S. Pat. No. 8,072,739, owned by the owners of the present invention, and hereby fully incorporated herein by reference.

Figure 17:
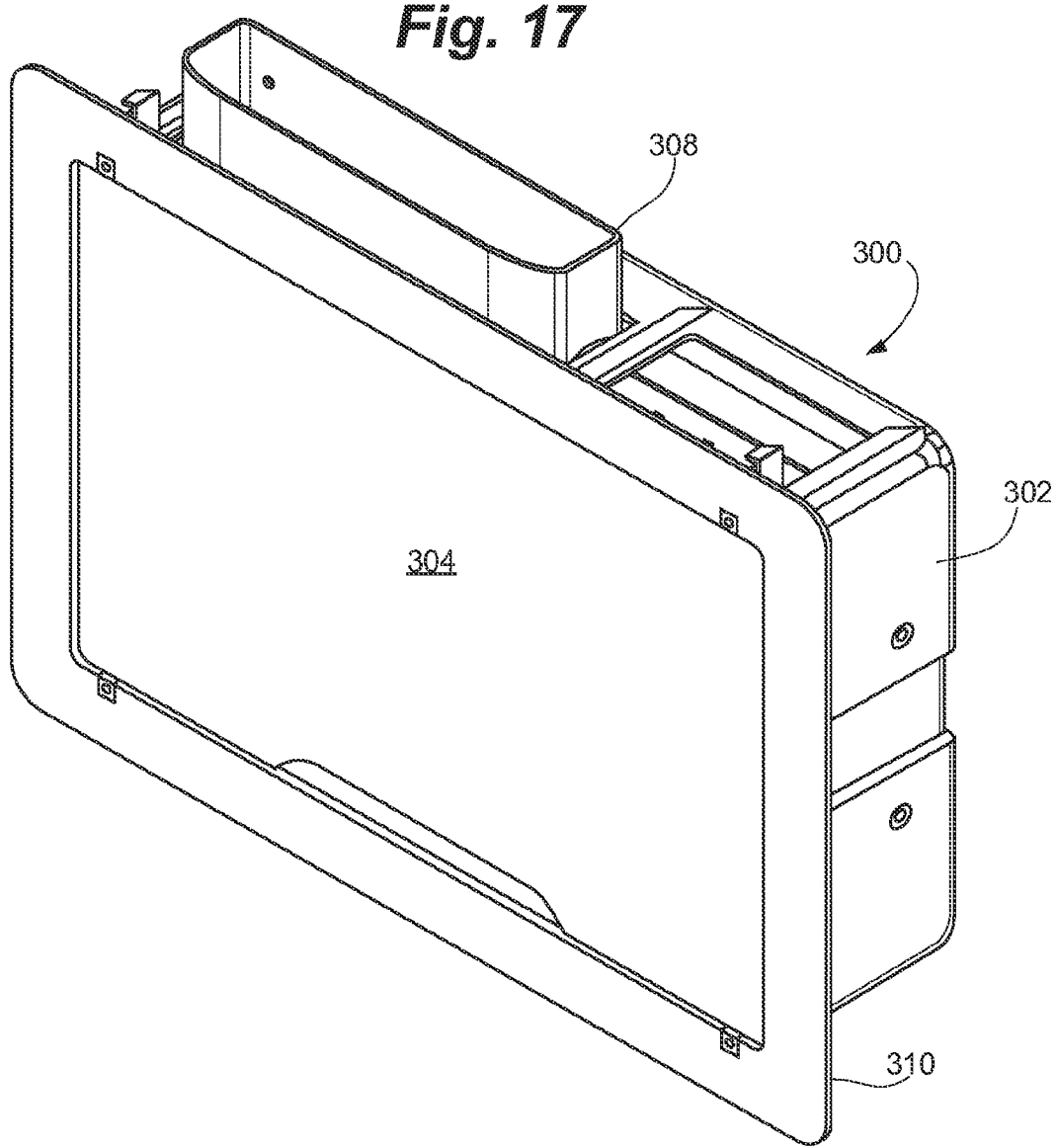
FIG. 17 is a front isometric view of an in-wall box assembly usable in conjunction with the mount of FIG. 1.
Figure 18:
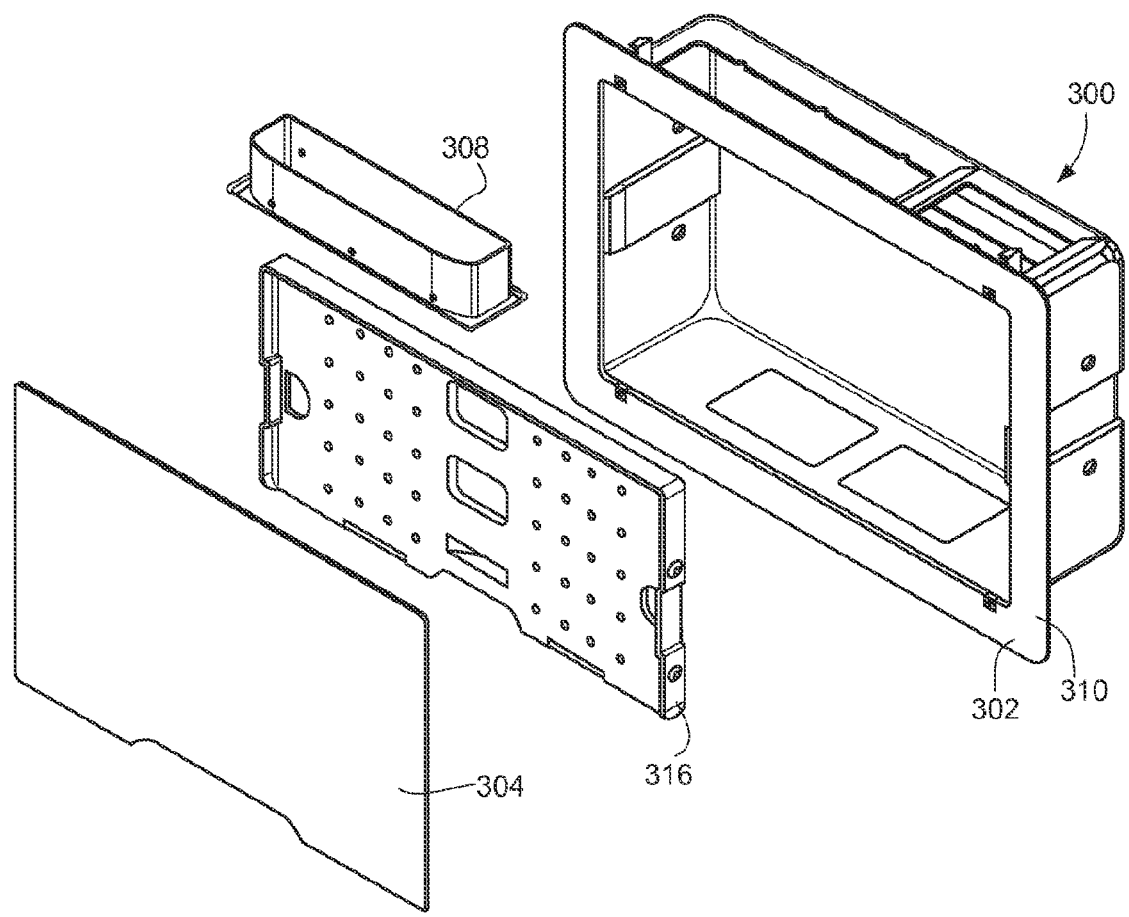
FIG. 18 is an exploded view of the in-wall box assembly of FIG. 17.

In some embodiments, it is advantageous to provide an in-wall box 300 as depicted in FIGS. 17 and 18 for the mounting and concealment of peripheral components. In-wall box 300 generally includes housing 302, door 304, component mounting board 306 inside housing 302, and removable wire duct 308, which extends through an aperture in housing 302. In-wall box 300 can be installed in an appropriate opening in a wall. Outwardly extending flange 310 of housing 302 can conceal the edges of the wall opening for a neat and aesthetic appearance.

In FIGS. 1, 21, and 22, there is depicted a further embodiment of the invention. Selectively positionable spacers 400 enable the use of fasteners of varying lengths to be used to fasten display 102 to upper attachment member 164 and lower attachment member 166. Each spacer 400 generally includes body 402 which is generally ovate in cross-section with opposing flat surfaces 403 on opposite sides. Groove pairs 404, 406, 408, are defined in shank 410 with enlarged head 412 at one end. Aperture 414 is defined through body 402 to receive a fastener. Attachment members 164, 166, define elongate apertures 416, with flattened sides 418 corresponding to flat surfaces 403 of spacer 400.

In use, spacer 400 is inserted through aperture 416 with flat surfaces 403 registered with flattened sides 418. Once any one of the groove pairs 404, 406, 408, are aligned with flattened sides 418, spacer 400 can be rotated 90 degrees in either rotational direction to secure spacer 400 in place in the attachment member 164, 166. Head 412 can thus be spaced at any one of three distances from the surface of attachment member 164, 166, as defined by the distance of the groove pair 404, 406, 408, from head 412, as needed to accommodate the length of the fastener to be inserted through aperture 414. It will be appreciated that, although three groove pairs are depicted, any other number of groove pairs could be provided on shank 410 to provide for more, or less, positions of head 412 relative to the component in which spacer 400 is used. It will also be appreciated that spacer 400 could be used with other components and devices to accomplish the same function within the scope of the invention.

In FIGS. 1, 3, 23, and 24 there is depicted a further advantageous feature of embodiments of the mount of the present invention. In particular, arm attachment bracket 133 is releasably attachable between horizontal brackets 114, 116, with lever-operated coupling mechanism 450. Coupling mechanism 450 generally includes front plate 452, slide plate 454, and rotatable actuator plate 456, which defines actuator slot 458. Front plate 452 is mounted to arm attachment bracket body 460 with fasteners 462. Slide plate 454 is reciprocally slidable in a vertical direction and has a flange portion (not depicted) that selectively engages with lip 464 of horizontal bracket 114. Control lever 466 is attached to projection 468 of rotatable actuator plate 456. As control lever is shifted in the direction of the arrows shown in FIG. 23 between the locked and unlocked positions (as indicated by the indicia on front plate 452), actuator plate 456 rotates about bolt 470. Bolt 472 rides in actuator slot 458, and causes slide plate 454 to reciprocate, thereby engaging and disengaging the flange portion of the plate from lip 464 of horizontal bracket 114 to enable arm attachment bracket 133 to be latched in place or unlatched so as to be removed. It will be appreciated by those of skill in the art that the mechanism could be directly operated by a sliding control instead of a lever, and further that the mechanism could be used in other contexts within a mounting device to couple a component between two spaced-apart members.

The foregoing descriptions present numerous specific details that provide a thorough understanding of various embodiments of the invention. It will be apparent to one skilled in the art that various embodiments, having been disclosed herein, may be practiced without some or all of these specific details. In other instances, components as are known to those of ordinary skill in the art have not been described in detail herein in order to avoid unnecessarily obscuring the present invention. It is to be understood that even though numerous characteristics and advantages of various embodiments are set forth in the foregoing description, together with details of the structure and function of various embodiments, this disclosure is illustrative only. Other embodiments may be constructed that nevertheless employ the principles and spirit of the present invention. Accordingly, this application is intended to cover any adaptations or variations of the invention.

For purposes of interpreting the claims for the present invention, it is expressly intended that the provisions of 35 U.S.C. §112(f) are not to be invoked unless the specific terms "means for" or "step for" are recited in a claim.

What is claimed is:

1. A mounting system for an electronic display, comprising: a wall interface; a display interface; and an arm assembly operably coupling the wall interface to the display interface, the display interface including a pair of spaced-apart vertical mounting assemblies operably coupled by a pair of spaced-apart horizontal assemblies, the vertical mounting assemblies being shiftable relative to each other with the horizontal assemblies; at least one of the horizontal assemblies including a center member, a first slider slidably shiftable on the center member and coupled to one of the vertical mounting assemblies, a second slider slidably shiftable on the center member and coupled to the other one of the vertical mounting assemblies, and a coordinating mechanism operably coupling the first slider and the second slider, the coordinating mechanism arranged such that the first slider and the second slider shift the same distance relative to the center member when either of the first slider or the second slider is shifted on the center member.

2. The mounting system of claim 1, wherein the coordinating assembly comprises a cable operably coupled to the first slider and the second slider.

3. The mounting system of claim 1, wherein each of the vertical mounting assemblies comprises a center member and a pair of attachment members, the attachment members being slidably shiftable on the center member to alter a length of the vertical mounting assembly.

4. The mounting system of claim 3, wherein at least one of the vertical mounting assemblies includes a coordinating mechanism operably coupling the attachment members such that the attachment members shift the same distance on the center member when either one of the attachment members is shifted on the center member.

5. The mounting system of claim 1, wherein the wall interface comprises a first member and a second member, the first member coupled to the second member with a hinge such that the wall interface is foldable.

6. The mounting system of claim 1, wherein the arm assembly comprises at least one arm having a first portion pivotally coupled to a second portion, the first portion comprising a pair of spaced apart members, each presenting a first end and an opposing second end, the first end of each of the spaced-apart members of the first portion pivotally coupled to the wall interface, the second end of each of the spaced-apart members pivotally coupled to a first end of the second portion, an opposing end of the second portion operably coupled to the display interface, the second portion of the arm being nestable between the spaced-apart members of the first portion when the arm is folded.

7. The mounting system of claim 6, wherein the arm defines a continuous concealed channel for receiving wires extending from the first end of one of the spaced apart members of the first portion to the end of the second portion operably coupled to the display interface.

8. The mounting system of claim 1, wherein the display interface includes a tilt assembly arranged so as to tilt an electronic display attached to the display interface about a substantially horizontal tilt axis disposed forwardly from the display interface.

9. The mounting system of claim 8, wherein the tilt assembly enables selective shifting of a location of the horizontal tilt axis relative to the display interface.

10. An electronic display system comprising: an electronic display; and a mount for attaching the electronic display to a wall, the mount comprising: a wall interface; a display interface; and an arm assembly operably coupling the wall interface to the display interface, the display interface including a pair of spaced-apart vertical mounting assemblies operably coupled by a pair of spaced-apart horizontal assemblies, the vertical mounting assemblies being shiftable relative to each other with the horizontal assemblies, the electronic display received on the vertical mounting assemblies; at least one of the horizontal assemblies including a center member, a first slider slidably shiftable on the center member and coupled to one of the vertical mounting assemblies, a second slider slidably shiftable on the center member and coupled to the other one of the vertical mounting assemblies, and a coordinating mechanism operably coupling the first slider and the second slider, the coordinating mechanism arranged such that the first slider and the second slider shift the same distance relative to the center member when either of the first slider or the second slider is shifted on the center member.

11. The electronic display system of claim 10, wherein the coordinating assembly comprises a cable operably coupled to the first slider and the second slider.

12. The electronic display system of claim 10, wherein each of the vertical mounting assemblies comprises a center member and a pair of attachment members, the attachment members being slidably shiftable on the center member to alter a length of the vertical mounting assembly.

13. The electronic display system of claim 12, wherein at least one of the vertical mounting assemblies includes a coordinating mechanism operably coupling the attachment members such that the attachment members shift the same distance on the center member when either one of the attachment members is shifted on the center member.

14. The electronic display system of claim 10, wherein the wall interface comprises a first member and a second member, the first member coupled to the second member with a hinge such that the wall interface is foldable.

15. The electronic display system of claim 10, wherein the arm assembly comprises at least one arm having a first portion pivotally coupled to a second portion, the first portion comprising a pair of spaced apart members, each presenting a first end and an opposing second end, the first end of each of the spaced-apart members of the first portion pivotally coupled to the wall interface, the second end of each of the spaced-apart members pivotally coupled to a first end of the second portion, an opposing end of the second portion operably coupled to the display interface, the second portion of the arm being nestable between the spaced-apart members of the first portion when the arm is folded.

16. The electronic display system of claim 15, wherein the arm defines a continuous concealed channel for receiving wires extending from the first end of one of the spaced apart members of the first portion to the end of the second portion operably coupled to the display interface.

17. The electronic display system of claim 10, wherein the display interface includes a tilt assembly arranged so as to tilt the electronic display attached to the display interface about a substantially horizontal tilt axis disposed forwardly from the display interface.

18. The electronic display system of claim 17, wherein the tilt assembly enables selective shifting of a location of the horizontal tilt axis relative to the display interface.

* * * * *